United States Patent
Hattori et al.

(10) Patent No.: US 7,701,693 B2
(45) Date of Patent: Apr. 20, 2010

(54) ELECTROSTATIC CHUCK WITH HEATER AND MANUFACTURING METHOD THEREOF

(75) Inventors: Akiyoshi Hattori, Nagoya (JP); Kazuhiro Nobori, Handa (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 111 days.

(21) Appl. No.: 11/854,071

(22) Filed: Sep. 12, 2007

(65) Prior Publication Data
US 2008/0174930 A1 Jul. 24, 2008

(30) Foreign Application Priority Data
Sep. 13, 2006 (JP) .............................. 2006-247685

(51) Int. Cl.
*H01L 21/683* (2006.01)
(52) U.S. Cl. ....................... 361/234; 428/469
(58) Field of Classification Search ................. 361/234; 279/128; 428/469
See application file for complete search history.

(56) References Cited

U.S. PATENT DOCUMENTS

| 7,416,793 | B2 * | 8/2008 | Matsuda et al. | ............. 428/701 |
|---|---|---|---|---|
| 7,442,450 | B2 * | 10/2008 | Aihara et al. | ............... 428/698 |
| 2005/0152089 | A1 * | 7/2005 | Matsuda et al. | ............. 361/234 |
| 2006/0073349 | A1 * | 4/2006 | Aihara et al. | ............... 428/469 |
| 2006/0169688 | A1 | 8/2006 | Mori et al. | |
| 2008/0276865 | A1 * | 11/2008 | Nishimizu et al. | .......... 118/500 |

FOREIGN PATENT DOCUMENTS

| JP | 2005-210077 A1 | 8/2005 |
|---|---|---|
| JP | 2006-128603 A1 | 5/2006 |
| KR | 2006-067832 A1 | 6/2006 |

* cited by examiner

*Primary Examiner*—Jared J Fureman
*Assistant Examiner*—Angela Brooks
(74) *Attorney, Agent, or Firm*—Burr & Brown

(57) ABSTRACT

An electrostatic chuck includes a base. The base has a support portion made of alumina ceramics, and a surface portion made of yttria ceramics. The surface portion forms at least a substrate mounting surface and side surface of the base on a surface of the support portion. Carbon contents in alumina ceramics of the support portion and yttria ceramics of the surface portion are 0.05 wt % or less.

9 Claims, 4 Drawing Sheets

ELECTROSTATIC CHUCK WITH HEATER AND MANUFACTURING METHOD THEREOF

CROSS-REFERENCE TO RELATED APPLICATION

This application is based upon and claims the benefit of priority from Patent Application No. 2006-247685 filed on Sep. 13, 2006, in the Japanese Patent Office, of which contents are incorporated herein by reference.

BACKGROUND OF THE INVENTION

1. Field of the Invention

The present invention relates to an electrostatic chuck and a manufacturing method thereof.

2. Description of the Related Art

Heretofore, in a manufacturing apparatus of a semiconductor device and a manufacturing apparatus of a liquid crystal device, an electrostatic chuck has been used in order to hold a substrate during a manufacturing process, for example, a deposition process and an etching process, and in order to convey the substrate. In general, the electrostatic chuck has a structure in which a dielectric electrode for generating electrostatic force is embedded in a base made of ceramics. Moreover, there is also an electrostatic chuck in which a resistance heating body is further embedded in the ceramics. A material of the base of the electrostatic chuck as described above is, for example, alumina having excellent heat resistance and corrosion resistance and high volume resistivity.

In recent years, for the electrostatic chuck, higher corrosion resistance than heretofore has been being required. For example, corrosion resistance sufficient for in-situ cleaning in the etching process of the semiconductor device is required. The in-situ cleaning is not a method, like conventional wet etching, of etching a semiconductor wafer after taking out the semiconductor wafer to the outside from a chamber where heating treatment and deposition treatment are performed therefore, but is a method of etching the semiconductor wafer by a plasma environment of halogen-series corrosive gas in the chamber. The electrostatic chuck will be exposed to such a severe plasma environment of the halogen-series corrosive gas.

In order to enhance corrosion resistance of a ceramic member applicable to the electrostatic chuck, a ceramic member has been proposed, in which an yttria sintered body having higher corrosion resistance than alumina is bonded to an upper surface of an alumina sintered body (Japanese Patent Laid-Open Publication No. 2006-128603).

The ceramic member described in Japanese Patent Laid Open Publication No. 2006-128603 contains a large amount of carbon in the alumina sintered body in order to enhance mechanical strength of the alumina sintered body. With regard to the ceramic member including such an alumina sintered body containing the large amount of carbon, the high mechanical strength thereof becomes advantageous, for example, when the ceramic member is applied to a heater. However, since carbon has conductivity, when the ceramic member is applied to the electrostatic chuck, there has been a case where the volume resistivity of alumina is decreased by a high temperature in an environment where the electrostatic chuck is used. In this case, there has been an apprehension that a current supplied to a dielectric electrode may be transmitted to alumina on the periphery of the dielectric electrode and flown to other portions, that is, that a so called leak current may be increased. There has been an apprehension that the increase of the leak current may cause a malfunction particularly in the case of an electrostatic chuck in which the dielectric electrode is disposed in a bonded portion between the alumina sintered body and the yttria sintered body. This is because there is a possibility that the leak current may be transmitted along the bonded portion to a surface of the base.

Moreover, in the ceramic member described above in Japanese Patent Laid-Open Publication No. 2006-128603, the yttria sintered body having high corrosion resistance will be formed only on an upper surface of the base when the ceramic member is applied to the electrostatic chuck. Here, with regard to the electrostatic chuck, not only an upper surface thereof but also a side surface thereof is exposed to the severe corrosive environment in the chamber where the electrostatic chuck is subjected to the treatment such as etching. Accordingly, in the electrostatic chuck in which the above-described yttria sintered body is formed only on the upper surface of the base, corrosion resistance of a side surface portion thereof is not always sufficient depending on etching conditions, and there has been a case where the insufficient corrosion resistance causes contaminations and particles.

The present invention advantageously solves the above-described problems. It is an object of the present invention to provide an electrostatic chuck, in which the leak current is suppressed, and the corrosion resistance is further excellent, and also to provide an advantageous manufacturing method of the electrostatic chuck.

SUMMARY OF THE INVENTION

The electrostatic chuck according to the present invention, which has achieved the above-described object includes: a plate-like base that is made of ceramics and has a substrate mounting surface on which a substrate is to be mounted; and a dielectric electrode embedded in the base, wherein the base includes a support portion made of alumina ceramics, and a surface portion that is made of yttria ceramics and forms at least the substrate mounting surface of the base on a surface of the base, and a carbon content in alumina ceramics in a vicinity of the dielectric electrode is 0.05 wt %.

Moreover, a manufacturing method of an electrostatic chuck includes the steps of: forming a plate-like alumina sintered body with a carbon content of 0.05 wt % or less from a raw material of alumina ceramics; forming a dielectric electrode on one surface of the alumina member; forming an yttria member so as to cover the dielectric electrode and the surface of the alumina member, on which the dielectric electrode is formed; and sintering the alumina member and the yttria member while integrally pressing the alumina member and the yttria member in a uniaxial direction, thereby forming a base.

In the electrostatic chuck according to the present invention, the carbon content in alumina ceramics in contact with the dielectric electrode is 0.05 wt % or less, thus making it possible to effectively suppress the leak current from the dielectric electrode. Moreover, the bonding strength of alumina ceramics to yttria ceramics is enhanced, whereby excellent suction force is exerted, and the ESC characteristics are less likely to be deteriorated even after a long-time use of the electrostatic chuck. Moreover, yttria ceramics having high corrosion resistance is formed on the surface of the base, and accordingly, the electrostatic chuck according to the present invention has excellent corrosion resistance even under the severe corrosive environment.

BRIEF DESCRIPTION OF THE DRAWINGS

The above and further objects, features and advantages of the invention will more fully appear in the detailed description of embodiments of the invention, when the same is read in conjunction with the drawings, in which.

DETAILED DESCRIPTION OF THE INVENTION

A description will be made of embodiments of an electrostatic chuck according to the present invention while using the drawings.

Figure 1:
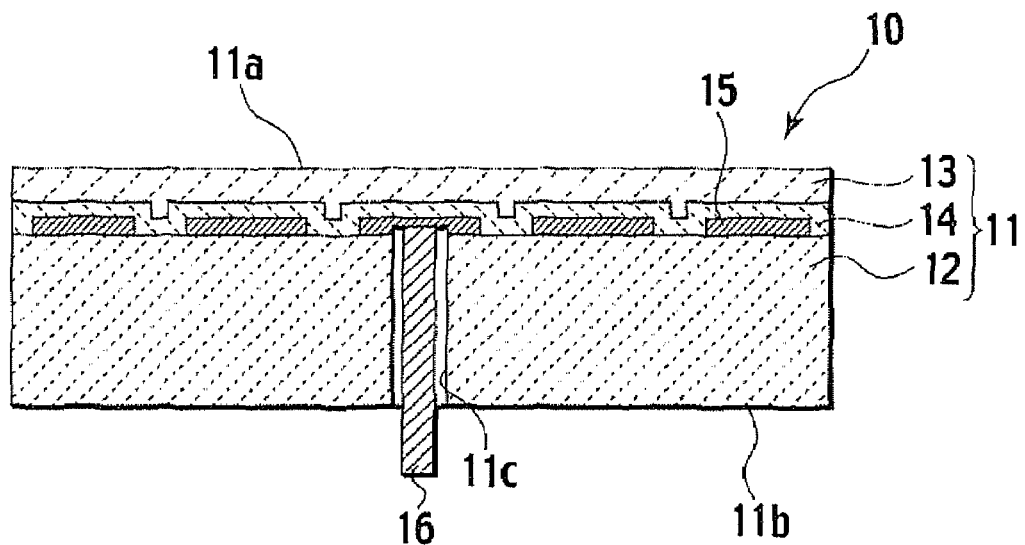
FIG. 1 is an explanatory view of an electrostatic chuck according to an embodiment of the present invention.

FIG. 1 is a cross-sectional view showing an electrostatic chuck according to an embodiment of the present invention. The electrostatic chuck 10 shown in FIG. 1 includes a substrate 11 made of ceramics having a substantial disc shape. The base 11 has a substrate mounting surface 11a on which a substrate (not shown) to be held on. The substrate to be held is, for example, a semiconductor wafer.

The substrate 11 includes a support portion 12 made of alumina ceramics, and a surface portion 13 that is made of yttria ceramics and formed above the support portion. The surface portion 13 has the substrate mounting surface 11a of the base 11. Between the surface portion 13 and the support portion 12, an intermediate ceramic portion 14 is formed, which contains a YAG ($3Y_2O_3.5Al_2O_3$: yttrium aluminum garnet) phase or a YAM ($2Y_2O_3.Al_2O_3$) phase.

In an inside of the base 11, dielectric electrode 15 for generating electrostatic force on the substrate mounting surface 11a is embedded parallel and adjacent to the substrate mounting surface 11a. In this embodiment shown in FIG. 1, the dielectric electrode 15 is formed between the support portion 12 and the surface portion 13. A region from the dielectric electrode 15 to the substrate mounting surface 11a, that is, a region of the surface portion 13 made of yttria ceramics, which includes the substrate mounting surface 11a, becomes a dielectric layer of the electrostatic chuck. Electric power is supplied to the dielectric electrode 15, whereby the dielectric layer is polarized, and generates electrostatic suction force on the substrate mounting surface 11a. The dielectric electrode 15 is formed of a mixture of ceramics and a conductive substance, such as W and WC, with a high melting point and a low coefficient of expansion.

In order to supply the electric power to the dielectric electrode 15, a conductive hole 11c that reaches the dielectric electrode 15 from a back surface 11b of the base 11 is formed. A terminal 16 is loaded into the conductive hole 11c, is bonded to the dielectric electrode 15 by brazing and the like, and is thereby electrically connected to the dielectric electrode 15. The terminal 16 is connected to a power supply through a power feeding member (not shown). Note that, instead of directly bonding the dielectric electrode 15 and the terminal 16 to each other, a configuration can also be adopted, in which a connection member (not shown) having conductivity is embedded between the dielectric electrode 15 and the terminal 16 in the support portion 12, and the terminal 16 is electrically connected to the electrode 15 while interposing the connection member therebetween. The connection member is interposed between the terminal 16 and the electrode 15, thus making it possible to suppress a strength decrease of the base 11, which is caused by drilling the conductive hole 11c.

In the electrostatic chuck of this embodiment shown in FIG. 1, alumina ceramics of the support portion 12 is ceramics containing alumina ($Al_2O_3$) as a main component. As alumina ceramics, it is preferable to apply ceramics made of alumina with a high purity; however, alumina ceramics concerned is not limited thereto. For example, it is possible to apply alumina ceramics containing sintering aides such as zirconia ($ZrO_2$), magnesia ($MgO$), and silica ($SiO_2$).

Moreover, in the electrostatic chuck according to the present invention, a carbon content in alumina ceramics in the vicinity of the dielectric electrode 15 is 0.05 wt % or less. In the embodiment shown in FIG. 1, a carbon content in the support portion 12 made of alumina ceramics is 0.05 wt % or less. The carbon content in the support portion 12 is 0.05 wt % or less, whereby insulating characteristics of the support portion 12 are further enhanced. In addition, a temperature dependency of volume resistivity is decreased, and high volume resistivity will be provided to the support portion 12 even at a high temperature. Moreover, the carbon content is set at 0.05 wt % or less, and the intermediate ceramic layer 14 is formed on an interface between yttria ceramics and alumina ceramics, whereby adhesion between the support portion 12 and the surface portion 13 is enhanced, and strength of the entire electrostatic chuck is enhanced. Therefore, when high voltage power is supplied to the electrode 15 in contact with the support portion 12, a leak current that leaks from the dielectric electrode 15 to the support portion 12 is suppressed. Moreover, propagation of the leak current to an outer circumferential edge portion along such a bonded portion between the support portion 12 and the surface portion 13 is also suppressed effectively by the presence of the intermediate ceramic portion 14. The leak current to the outer circumferential edge portion is reduced, whereby the electric power supplied to the electrode 15 is converted efficiently into the suction force.

A more preferable carbon content in alumina ceramics of the support portion 12 is 0.03 wt % or less. In this case, the leak current is further suppressed, whereby higher suction force and long-term reliability can be obtained.

In the electrostatic chuck according to the embodiment shown in FIG. 1, alumina ceramics of the support portion 12 is substantially homogeneous in a thickness direction, and there are no variations in the carbon content in the thickness direction. However, in order to suppress the leak current, the carbon content in alumina ceramics in the vicinity of the dielectric electrode just needs to be 0.05 wt % or less, and in this case, the above-described effects can be obtained. Specifically, the carbon content may be changed in the thickness direction of the base 11. For example, the carbon content may exceed 0.05 wt % in the vicinity of the back surface of the base 11.

Note that even alumina ceramics in which the carbon content is 0.05 wt % or less can obtain mechanical strength sufficient for the electrostatic chuck. Moreover, the mechanical strength can be enhanced by means for enhancing the strength, which is other than containing carbon. For example, alumina ceramics is further densified by adjusting the sintering aids and sintering conditions, thus making it possible to enhance the mechanical strength.

Next, a description will be made of a more suitable mode of the electrostatic chuck shown in FIG. 1.

With regard to alumina ceramics of the support portion 12, it is preferable that the volume resistivity thereof be $1\times10^{16}$ $\Omega\cdot$cm or more at room temperature, and be $1\times10^{14}$ $\Omega\cdot$cm or more at 150° C. When the volume resistivity drops down below these numeric values, there is an apprehension that the leak current may be increased. Alumina ceramics with the volume resistivity within the above-described numeric value range can be obtained, for example, in such a manner that a raw material of alumina ceramics is temporarily fired to thereby remove a binder and a residual carbon component therefrom, and to reduce the carbon content.

It is preferable that an alumina content in the alumina ceramics be 95 wt % or more. Contents of components other than alumina are set at 5 wt % or less, whereby impurities diffused into such an yttria ceramic layer when the electrostatic chuck is manufactured can be suppressed. In such a way, contamination of the substrate held on the electrostatic chuck 10 can be prevented. A more preferable alumina content in alumina ceramics is 98 wt % or more.

It is preferable that a relative density of the support portion 12 made of alumina ceramics be 95% or more. The relative density is 95% or more, whereby mechanical strength of the support portion 12 can be enhanced. A more preferable relative density of alumina ceramics is 98% or more. Moreover, it is preferable that four-point bending strength (JIS R1601) of the support portion 12 at the room temperature be 400 MPa or more. More preferable four-point bending strength is 600 MPa or more. Furthermore, an average particle diameter of alumina ceramics of the Support portion 12 is preferably 1 to 10 μm, more preferably, 1 to 3 μm.

Yttria ceramics of the surface portion 13 is ceramics containing yttria ($Y_2O_3$) as a main component. As yttria ceramics, it is preferable to apply ceramics made of yttria with a high purity; however, yttria ceramics concerned is not limited thereto. For example, it is possible to apply yttria ceramics in which fine particles of silicon carbide (SiC), silicon nitride ($Si_3N_4$), or the like are diffused as a toughening agent and the sintering aids into yttria. Yttria ceramics containing these toughening agents and sintering aids can enhance mechanical strength thereof, such as bending strength and fracture toughness.

It is preferable that an amount of yttria contained in yttria ceramics be 90 wt % or more. Such an yttria amount is 90 wt % or more, whereby a decrease of corrosion resistance of yttria ceramics can be prevented, and the contamination of the substrate can also be prevented. More preferably, the yttria content is 99 wt % or more.

With regard to the surface portion 13 made of yttria ceramics, it is preferable that the volume resistivity thereof be $1\times10^{16}$ $\Omega\cdot$cm or more at the room temperature, and be $1\times10^{15}$ $\Omega\cdot$cm or more at 150° C. In a region containing the substrate mounting surface 11a above the dielectric electrode 15, the surface portion 13 becomes the dielectric layer, and the volume resistivity of the dielectric layer is $1\times10^{16}$ $\Omega\cdot$cm or more at the room temperature, and is $1\times10^{15}$ $\Omega\cdot$cm or more at 150° C. From these facts, the electrostatic chuck can exert high electrostatic suction force, and can enhance the attachment/detachment response. Moreover, when the volume resistivity satisfies these numeric values, the leak current can be suppressed effectively.

It is preferable that the intermediate ceramic portion 14 formed on the interface between the support portion 12 made of alumina ceramics and the surface portion 13 made of yttria ceramics contains at least one of the YAG phase and the YAM phase, and that a thickness of the intermediate ceramic portion be 10 μm or more to 100 μm or less. The thickness of the intermediate ceramic portion is 10 μm or more, whereby the adhesion between the support portion 12 and the surface portion 13 is enhanced, the strength of the entire electrostatic chuck is enhanced, and the propagation of the leak current to the outer circumferential edge portion along the bonded portion between the support portion 12 and the surface portion 13 is also suppressed effectively. When the thickness of the intermediate ceramic portion exceeds 100 μm, crystal grains of the YAG phase or the YAM phase are bloated, causing a disadvantage that the strength of the intermediate ceramic portion is decreased.

With regard to yttria ceramics of the surface portion 13, it is preferable that a thickness of a region thereof including the substrate mounting surface 11a of the base 11 be 0.2 mm to 0.5 mm. The region is a region corresponding to the dielectric layer of the electrostatic chuck, and the thickness thereof is within a range of 0.2 mm to 0.5 mm, whereby the electrostatic chuck can exert high suction force, and can enhance the attachment/detachment response. A more preferable thickness of the region is 0.3 mm to 0.4 mm.

It is preferable that a relative density of the surface portion 13 made of yttria ceramics be 95% or more. The relative density of the region is 95% or more, whereby the electrostatic chuck can exert high electrostatic suction force, and can enhance the attachment/detachment response. Moreover, the relative density is 95% or more, mechanical strength such as bending strength and fracture toughness of yttria ceramics can be enhanced, and high corrosion resistance can be provided thereto. A more preferable relative density of yttria ceramics is 98% or more. Furthermore, an average particle diameter of yttria ceramics is preferably 10 μm or less from a viewpoint of mechanical characteristics.

With regard to yttria ceramics of the surface portion 13, it is preferable that a withstand voltage of a portion thereof on which the substrate mounting surface 11a is formed be 12 kV/mm or more. The portion on which the substrate mounting surface 11a is formed is a portion corresponding to the dielectric layer of the electrostatic chuck. Accordingly, it is preferable that the surface portion 13 be provided with a withstand voltage, by which the Coulomb-type electrostatic chuck 10 can stand a high voltage applied to the dielectric electrode 15. Specifically, it is preferable that the surface portion 13 be provided with the withstand voltage of 12 kV/mm or more.

With regard to yttria ceramics of the surface portion 13, it is preferable that surface roughness of the substrate mounting surface 11a be 0.4 μm or less in centerline average roughness Ra. The surface roughness of the substrate mounting surface 11a is 0.4 μm or less, whereby the electrostatic chuck can obtain suction force sufficient for sucking the substrate, and further, can suppress generation of particles owing to friction between the substrate and the base 11.

It is preferable that a difference in coefficient of thermal expansion (CTE) between alumina ceramics of the support portion 12 and yttria ceramics of the surface portion 13 be $0.50\times10^{-6}$/K or less. Note that the difference in coefficient of thermal expansion is a difference between the coefficients of thermal expansion, which are measured within a temperature range from the room temperature to 1200° C. The difference in coefficient of thermal expansion is $0.50\times10^{-6}$/K or less, whereby alumina ceramics and yttria ceramics can be bonded more firmly to each other. A more preferable coefficient of thermal expansion is $0.30 \times 10^{-6}$/K or less, and a still more preferable coefficient of thermal expansion is $0.10 \times 10^{-6}$/K or less.

Moreover, it is preferable that the coefficient of thermal expansion of alumina ceramics of the support portion 12 be larger than the coefficient of thermal expansion of yttria ceramics of the surface portion 13. When the coefficient of thermal expansion of alumina ceramics is larger than that of yttria ceramics, a thermal stress applied to yttria ceramics can be converted into a compression stress in a temperature drop process after firing in a manufacturing process of the electrostatic chuck, and an occurrence of a crack on yttria ceramics can be prevented. For example, adjustment of the coefficients of thermal expansion can be realized by adjusting an amount of zirconia, magnesia, or silica, which is contained in alumina ceramics, and an amount of alumina, silica, zirconia, silicon carbide, silicon nitride, or the like. As an example, the amount of alumina contained in alumina ceramics is set at 98 wt %, the amount of silica contained therein is set at 2 wt %, and the amount of yttria contained in yttria ceramics is set at 99.9 wt % or more, whereby an appropriate difference between the coefficients of thermal expansion can be obtained.

The intermediate ceramic portion 14 containing yttrium and aluminum is formed between alumina ceramics of the support portion 12 and yttrium ceramics of the surface portion 13. The intermediate ceramic portion 14 can be formed, for example, by sintering the support portion 12 and the surface portion 13 while pressing both thereof at a high temperature. The intermediate ceramic portion 14 is formed, whereby the support portion 12 and the surface portion 13 are bonded to each other while interposing the intermediate ceramic portion 14 therebetween. In such a way, the support portion 12 and the surface portion 13 can be bonded more firmly to each other.

The intermediate ceramic portion 14 just needs to be an oxide ceramic containing yttrium and aluminum, and a type of a compound is not limited. For example, the intermediate ceramic portion 14 can contain an yttrium oxide and an aluminum oxide individually, and moreover, can contain a composite oxide of yttrium and aluminum. Specifically, it is more preferable that the intermediate ceramic portion 14 contain YAG ($3Y_2O_3 \cdot 5Al_2O_3$: yttrium aluminum garnet), YAM ($2Y_2O_3 \cdot Al_2O_3$), YAL ($Y_2O_3 \cdot Al_2O_3$), or the like.

The intermediate ceramic portion 14 can include a plurality of layers different in contents of yttrium and aluminum from one another. For example, the intermediate ceramic portion 14 can include a YAG layer and YAM layer. The intermediate ceramic portion 14 includes the plurality of layers, whereby a composition thereof can be changed step by step between the support portion 12 and the surface portion 13, and hence, the support portion 12 and the surface portion 13 can be bonded more firmly to each other. Moreover, the intermediate ceramic portion 14 may be formed of a functionally gradient material in which the contents of yttrium and aluminum are changed continuously in the thickness direction.

It is preferable that the dielectric electrode 15 be interposed between the support portion 12 made of alumina ceramics and the surface portion 13 made of yttria ceramics. The dielectric electrode 15 may be embedded in the support portion or the surface portion; however, the dielectric electrode 15 is embedded between the support portion 12 and the surface portion 13, whereby the manufacturing process can be simplified more than in the case where the dielectric electrode 15 is embedded in the inside of the support portion 12 or the inside of the surface portion 13. Moreover, yttria ceramics having high volume resistivity can function as the dielectric layer of the electrostatic chuck 10 utilizing Coulomb force, and the electrostatic chuck 10 can exert excellent suction characteristics, and in addition, can enhance the attachment/detachment response.

As an example where the dielectric electrode 15 is interposed between the support portion 12 and the surface portion 13, there is an example where the dielectric electrode 15 is in contact with an upper surface of the support portion 12 as shown in FIG. 1. In one example of the manufacturing process of the electrostatic chuck 10, components of alumina ceramics and yttria ceramics are mutually diffused through gaps and periphery of the dielectric electrode 15. Moreover, alumina contained in the dielectric electrode 15 and yttria ceramics of the surface portion 13 react with each other. As a result, the ceramic portion 14 is formed on the periphery of the dielectric electrode 15 so as to cover the dielectric electrode 15.

It is preferable that a difference of the dielectric electrode 15 from the support portion 12 and the surface portion 13 in coefficient of thermal expansion be $3 \times 10^{-6}$/K or less. The difference in coefficient of thermal expansion is $3 \times 10^{-6}$/K or less, whereby adhesion between the dielectric electrode 15 and the base 11 can be enhanced. Moreover, a crack can be prevented from occurring in the region of the base 11, which is on the periphery of the dielectric electrode 15.

It is preferable that the dielectric electrode 15 be formed of a mixture of conductive material powder with a melting point of 1650° C. or more and of alumina powder. The dielectric electrode 15 is formed of such a high melting-point material, whereby the dielectric electrode 15 is not diffused into the ceramic portions during the manufacturing process of the electrostatic chuck 10, and low resistance thereof can be realized. Moreover, the alumina powder in the dielectric electrode 15 is likely to be sintered, and adheres the electrode 15 and the support portion 12 firmly to each other while forming the intermediate portion 14 between the dielectric layer 15 and the surface portion 13. Specifically, the high melting-point material for use in the dielectric electrode 15 includes a high melting-point material containing at least one of materials, which are: tungsten (W); niobium (Nb); molybdenum (Mo); tungsten carbide (WC); molybdenum carbide (MoC); a tungsten-molybdenum alloy; hafnium (Hf); titanium (Ti); tantalum (Ta); Rhodium (Rh); rhenium (Re); and platinum (Pt). In particular, W and WC are more preferable from a viewpoint of the melting point.

Means for forming the dielectric electrode 15 is not limited, and the dielectric electrode 15 is a bulk member of an electrode material (high melting-point material), a sheet (foil) thereof, a mesh (wire netting) thereof, punching metal thereof, a thin film thereof formed by chemical vapor deposition (CVD) or physical vapor deposition (PVD), or the like. However, it is preferable that the dielectric electrode 15 be a dielectric electrode formed by printing a paste containing powders (mixture of the high melting-point material powder and the alumina powder) of the above-described electrode materials from the above-described viewpoint. This is because, further, flatness of the dielectric electrode 15 can be enhanced by forming the dielectric electrode 15 in such a manner that the paste is printed on an alumina sintered body.

The flatness of the dielectric electrode 15 is preferably 200 μm or less, more preferably, 100 μm or less. The flatness is 200 μm or less, whereby a film thickness distribution of the surface portion 13 that becomes the dielectric layer is uniformed, thus making it possible to allow the electrostatic chuck to exert uniform suction force over the entire substrate mounting surface 11$a$.

A planar shape of the dielectric electrode 15 is not limited, either. For example, the dielectric electrode 15 can be formed into a circular shape, a semi-circular shape, a comb-teeth shape, a perforated shape, and the like. Moreover, the dielectric electrode 15 may be one of a unipolar type in which the number of electrodes in the electrostatic chuck is one, may be one of a bipolar type in which the number is two, or may be one in which the electrodes are divided into more than two.

It is preferable that the support portion 12, surface portion 13 and dielectric electrode 15 of the base 11 be one formed integrally by the sintering. By being sintered integrally, the support portion 12, the surface portion 13, and the dielectric electrode 15 are bonded more firmly to one another. From this fact, an electrical failure such as arcing can also be prevented. Moreover, there is also such an advantage that an electrostatic chuck having excellent thermal conductivity and high cooling performance can be obtained in comparison with the case where the support portion 12, the surface portion 13 and the dielectric electrode 15 are bonded to one another by using an organic adhesive, followed by integration. It is more preferable that the support portion 12, the surface portion 13 and the dielectric electrode 15 be an integral sintered body formed by sintering using a hot press method among sintering means.

Figure 2:
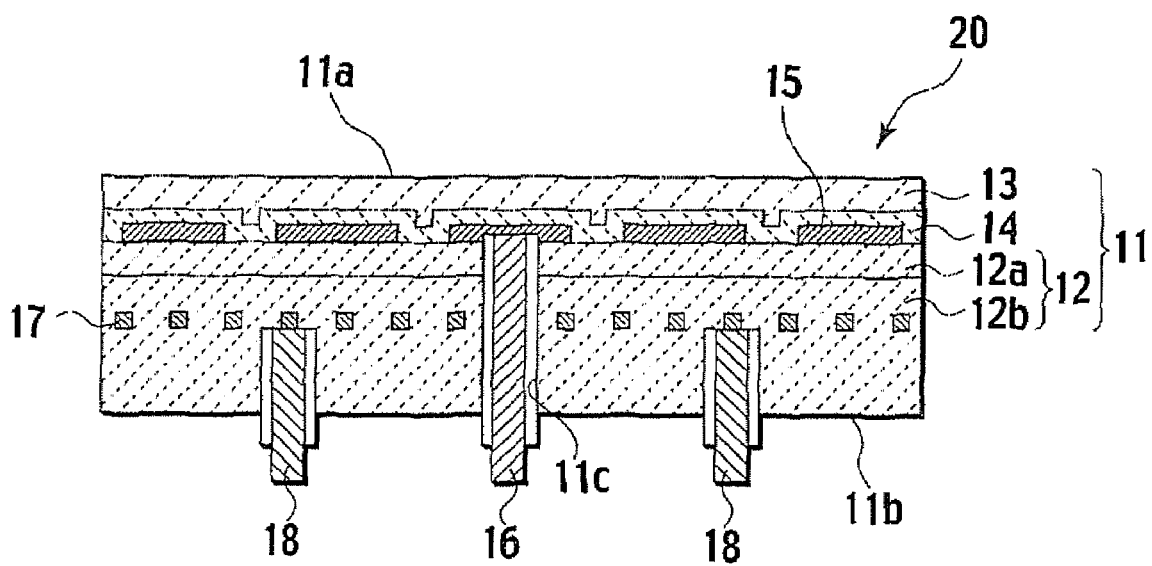
FIG. 2 is an explanatory view of an electrostatic chuck according to another embodiment of the present invention.

Next, a description will be made of another embodiment by using FIG. 2. FIG. 2 is a cross-sectional view showing an electrostatic chuck according to the other embodiment concerned of the present invention. With regard to the electrostatic chuck 20 shown in FIG. 2, the same reference numerals are assigned to the same members as those of the electrostatic chuck 10 shown in FIG. 1. Therefore, in the following description regarding the electrostatic chuck 20, a duplicate description of the same members as those of the electrostatic chuck 10 shown in FIG. 1 will be omitted.

The electrostatic chuck 20 shown in FIG. 2 is different from the electrostatic chuck 10 shown in FIG. 1 in the following points. The inside of the base 11, and specifically, the support portion 12 made of alumina ceramics includes two regions different in carbon content from each other. In other words, the support portion 12 is composed of an upper portion 12a in contact with the dielectric electrode 15, and a lower portion 12b located under the upper portion. Moreover, the lower portion 12b contains 0.05 to 0.25 wt % carbon in alumina ceramics, and a resistance heating body 17 is embedded in the lower portion 12b. Here, a carbon content of the upper portion 12a in contact with the dielectric electrode 15 is 0.05 wt % or less.

Then, tip end portions of made-for-heating-body terminals 18 are fixedly attached onto the resistance heating body 17, whereby the resistance heating body 17 and the made-for-heating-body terminals 18 are electrically connected to each other. The made-for-heating-body terminals 18 are connected to power feeding members (not shown), and are connected to a power supply through the power feeding members.

The resistance heating body 17 is made of a high melting-point material, and a similar material to that of the dielectric electrode 15 can be applied thereto. For example, at least one of materials, which are: tungsten (W); niobium (Nb); molybdenum (Mo); tungsten carbide (WC); molybdenum carbide (MoC); a tungsten-molybdenum alloy; hafnium (Hf); titanium (Ti); tantalum (Ta); rhodium (Rh); rhenium (Re); and platinum (Pt), can be applied to the resistance heating body 17. However, it is particularly preferable to use Nb.

Moreover, means for forming the resistance heating body 17 is not limited, and for example, there are one formed by printing the paste containing the electrode material powder (high melting-point material powder), disposing a bulk member and a sheet (foil) of the resistance heating body 17 (high melting-point material), which have a linear shape, a coil, shape, a band shape, and the like, and the like.

Moreover, a planar shape of the resistance heating body 17 is not limited, either. For example, the resistance heating body 17 can be formed into a spiral shape, a mesh (wire netting) shape, a perforated shape (punching metal), a shape having a plurality of folded portions, and the like. Furthermore, the resistance heating body 17 may be a single one, or plural ones formed by division. For example, the resistance heating body 17 can be formed as resistance heating bodies divided into two regions, which are: a support portion of the substrate mounting surface 11a; and a circumferential portion thereof.

The electrostatic chuck 20 according to this embodiment shown in FIG. 2 includes the resistance heating body 17, thereby can adjust, by the resistance heating body 17, a temperature of the substrate sucked and held by the electrostatic chuck 20. Moreover, even the electrostatic chuck 20 including the resistance heating body 17 has the effects derived from the present invention, which are described by the electrostatic chuck shown in FIG. 1, and in addition, has effects derived from other configuration requirements in a similar way. In addition, in the lower portion 12b of the support portion 12, in which the resistance heating body 17 is embedded, a carbon content in alumina ceramics is 0.05 wt % to 0.25 wt %. The carbon content in alumina ceramics on the periphery of the resistance heating body 17 is 0.05 wt % to 0.25 wt %, whereby niobium contained in the resistance heating body 17 can be suppressed from being diffused into alumina ceramics. In such a way, variations of heating characteristics of the resistance heating body 17 can be prevented. Moreover, in the upper portion 12a of the support portion 12, which is in contact with the dielectric electrode 15, the carbon content therein is 0.05 wt % or less, and accordingly, insulating characteristics in the vicinity of the dielectric electrode are ensured sufficiently.

Figure 3:
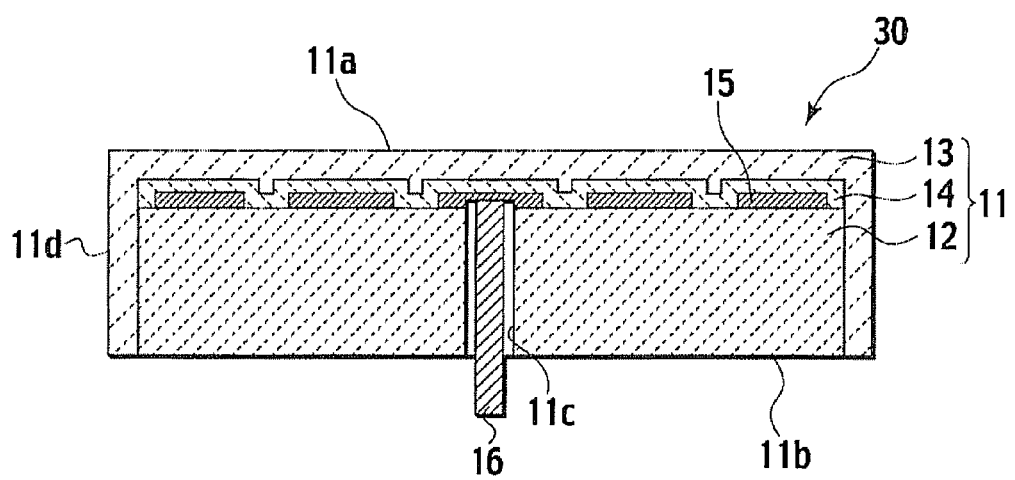
FIG. 3 is an explanatory view of an electrostatic chuck according to another embodiment of the present invention.

Next, a description will be made of another embodiment of the present invention by using FIG. 3. FIG. 3 is a cross-sectional view showing an electrostatic chuck according to the other embodiment concerned of the present invention. Note that, with regard to the electrostatic chuck 30 shown in FIG. 3, the same reference numerals are assigned to the same members as those of the electrostatic chuck 10 shown in FIG. 1. In the following description, a duplicate description of the same members will be omitted.

The electrostatic chuck according to this embodiment shown in FIG. 3 is an example where the surface portion 13 made of yttria ceramics is formed not only above the support portion 12 but also so as to cover a part of a side surface of the electrostatic chuck 30. As a more preferable example, the entire side surface is formed of yttria ceramics. In addition, the surface portion 13 forms the upper surface (substrate mounting surface 11a) of the substrate 11, and the side surface 11d thereof. The substrate mounting surface 11a and side surface 11d of the base 11 are exposed to a severe corrosive environment, and these portions are formed of yttria ceramics superior in corrosion resistance to alumina ceramics, whereby the corrosion resistance of the base is enhanced. Therefore, an apprehension is avoided that the side surface portion of the base may be corroded to cause a chemical reaction, thereby generating halide of aluminum, and the like as in the conventionally known electrostatic chuck in public, in which only the substrate mounting surface of the base is made of yttria ceramics.

Moreover, the fact that the side surface portion of the base 11 is covered with the surface portion 13 made of yttria ceramics also brings an effect that the leak current can be effectively suppressed from being transmitted to the surface of the base 11. As described above, the leak current generated in the vicinity of the dielectric electrode 15 propagates along the bonded portion between the support portion 12 made of alumina ceramics and the surface portion 13. In the conventional electrostatic chuck, yttria ceramics is formed only on the substrate mounting surface of the base, and accordingly, the above-described bonded portion is exposed to the side surface of the base. Hence, there is an apprehension that the leak current may be transmitted to the surface of the base from the bonded portion exposed to the side surface of the base. As opposed to this, in the electrostatic chuck according to this embodiment, the side surface 11*d* of the base is covered with the surface portion 13 made of ceramics having high insulating characteristics, and accordingly, the leak current propagating along the bonded portion is prevented from being transmitted to the side surface 11*d* of the base. Moreover, the bonded portion between the support portion 12 and the surface portion 13 is exposed not to the side surface 11*d* of the base but to the back surface 11*b*. Hence, the leak current is attenuated in a route reaching the back surface 11*b*. Also by this fact, the leak current can be effectively suppressed from being transmitted to the surface of the base 11.

Moreover, with regard to yttria ceramics of the surface portion 13, it is preferable that a thickness of a region thereof including a side surface 11*d* of the base 11 be 0.2 mm to 10 mm. The region hardly affects the electrostatic suction force of the dielectric layer, and the thickness thereof can be determined from a viewpoint of the corrosion resistance. When the thickness of the region including the side surface 11*d* of the base is less than 0.2 mm, it becomes difficult to obtain sufficient corrosion resistance. From the viewpoint of the corrosion resistance, there is no upper limit of the thickness of the region. However, when the thickness exceeds 10 mm, there is an apprehension that yield in manufacturing the electrostatic chuck may be decreased.

A relative density of the region of the surface portion 13, which includes the side surface 11*d* of the base 11, is not particularly limited; however, from a viewpoint of the corrosion resistance and the mechanical strength, it is preferable that the relative density be 95% or more in a similar way to the region including the substrate mounting surface 11*a* of the base 11.

In the embodiment shown in FIG. 3, the surface portion 13 is formed above the support portion 12 and on a part of the side surface thereof. However, the surface portion 13 can be formed not only above the support portion 12 and on the side surface thereof but also so as to cover the lower surface thereof.

Figure 4:
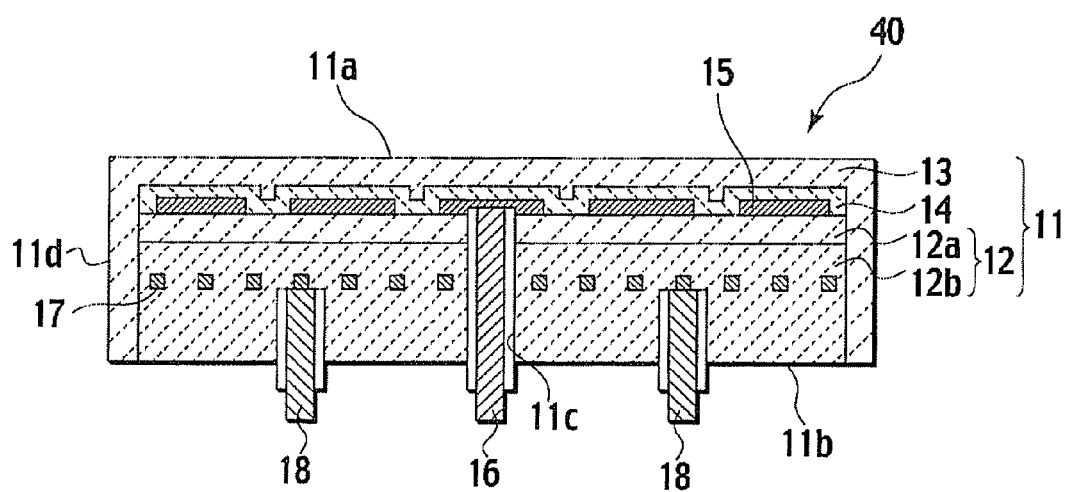
FIG. 4 is an explanatory view of an electrostatic chuck according to another embodiment of the present invention.

Next, a description will be made of another embodiment of the present invention by using FIG. 4. FIG. 4 is a cross-sectional view showing an electrostatic chuck according to the other embodiment concerned of the present invention. Note that, with regard to the electrostatic chuck 40 shown in FIG. 4, the same reference numerals are assigned to the same members as those of the electrostatic chuck 20 shown in FIG. 2. In the following description, a duplicate description of the same members will be omitted.

Moreover, the electrostatic chuck 40 shown in FIG. 4 is an example where the electrostatic chuck 40 is an electrostatic chuck including the resistance heating body 17 in a similar way to the embodiment shown in FIG. 2, and the surface portion 13 made of yttria ceramics is formed not only above the support portion 12 but also so as to cover a part of the side surface in a similar way to the embodiment shown in FIG. 3. As a more preferable example, the entire side surface is formed of yttria ceramics. Hence, the electrostatic chuck 40 is provided with a similar effect to that of the embodiment shown in FIG. 2. In addition, in a similar way to the embodiment shown in FIG. 3, the substrate mounting surface 11*a* and side surface 11*d* of the base 1 are formed of yttria ceramics superior in corrosion resistance to alumina ceramics, whereby the electrostatic chuck 40 is provided with effects that the corrosion resistance of the base is enhanced, and the like.

Next, a description will be made of a manufacturing method of the electrostatic chuck according to the present invention. As an example, the electrostatic chuck according to the present invention can be manufactured by a method including the steps of: forming a plate-like alumina member with a carbon content of 0.05 wt % or less from a raw material of alumina ceramics, followed by sintering; forming a dielectric electrode on one surface of the alumina member; covering the dielectric electrode, the surface of the alumina member, and a side surface thereof with raw material powder of yttria with a carbon content of 0.05 wt % or less, thereby forming an yttria member, the surface of the alumina member having the dielectric electrode formed thereon; and integrally sintering the alumina member and the yttria member while applying a pressure thereto in a uniaxial direction, thereby forming a base.

A description will be made of an example of the manufacturing method by using FIG. 5A to FIG. 5F. FIG. 5A to FIG. 5F are process views of an example of the manufacturing method according to the present invention.

Figure 5A:
FIGS. 5A to 5F are process views of an example of a manufacturing method according to the present invention.

First, as shown in FIG. 5A, a plate-like alumina member 120 with a carbon content of 0.05 wt % or less is molded from the raw material of alumina ceramics, followed by sintering. In FIG. 5A, a sintered body is shown as the alumina member 120. This step is a step of fabricating a member including the support portion 12 in the base 11 of the electrostatic chuck 10. Specifically, a binder, water, a dispersant, and the like are added to the raw material powder of alumina ceramics, followed by mixing, and slurry of the raw material is prepared. For the raw material powder, alumina powder, mixed powder of the alumina powder with zirconia powder, magnesia powder, silica powder or the like, and the like can be used. However, an amount of alumina contained in the raw material powder is preferably 95 wt % or more, more preferably, 98 wt % or more. Moreover, a purity of the alumina powder is preferably 99.5 wt % or more, more preferably, 99.9 wt % or more. Moreover, an average particle diameter of the alumina powder or the mixed powder is preferably 0.2 μm to 1.0 μm.

After an organic binder and the like are further added to the raw material powder, slurry of the raw material is adjusted. Thereafter, after the slurry is granulated by a spray dryer, granules thus obtained are calcined in the air, and the organic binder is oxidized and removed. In such a way, calcined granules easy to be molded can be obtained while suppressing the carbon content in the alumina member at 0.05 wt % or less.

By using the calcined granules, the alumina member is molded by a molding method such as a metal molding method, a cold isostatic pressing (CIP) method.

In order to obtain an alumina member 121 as a sintered body, for example, the molded body obtained above is fired by a sintering method such as the hot press method and an atmospheric pressure sintering method in an atmosphere of inert gas such as nitrogen gas and argon gas, under a reduced pressure, or in an oxidation atmosphere such as the air. It is preferable to set a firing temperature at 1400° C. to 1700° C. A more preferable firing temperature is 1600° C. to 1700° C. The alumina molded body is fired at a relatively low temperature, excessive grain growth on the alumina member 121 as the sintered body can be prevented, and eventually, the mechanical strength of the base 11 of the electrostatic chuck can be enhanced. The fact that the alumina member 121 is the sintered body is advantageous in the following points. Specifically, the alumina member is densified, the strength thereof is increased, and in such a way, flatness of the surface of the alumina member can be increased, and formation accuracy of the dielectric electrode to be formed on the surface can be enhanced.

Figure 5B:
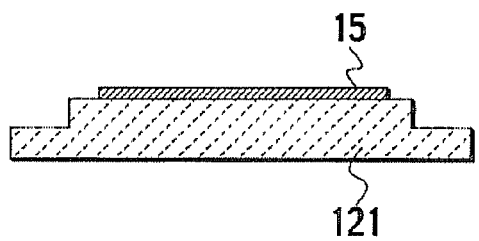

Next, as shown in FIG. 5B, the dielectric electrode 15 is formed on the alumina member 121. The dielectric electrode 15 can be formed by printing the paste containing the electrode material powder on a surface of the alumina member 121 by using a screen printing method and the like. The screen printing method can enhance the flatness of the dielectric electrode 15, can easily form, with high accuracy, the dielectric electrode 15 with a variety of plane shapes, and accordingly, is preferable. It is preferable that the paste be a paste in which the alumina powder is mixed with the high melting-point material powder. The alumina powder is contained in the paste, whereby the coefficient of thermal expansion of the dielectric electrode 15 can be similar to that of the support portion 12 or surface portion 13 of the base 11, and the adhesion between the base 11 and the dielectric electrode 15 can be enhanced since the alumina powder can be easily sintered. It is preferable that a total amount of the alumina powder contained in the printing paste be 5 vol % to 30 vol %. If the total amount is 5 vol % to 30 vol %, then a high effect of enhancing the adhesion can be obtained without affecting a function of the dielectric electrode 15. Note that, preferably, the electrode material powder is a mixture of WC and the alumina powder with a carbon amount of 0.05 wt % or less, or a mixture of W and the alumina powder with a carbon amount of 0.05 wt % to 0.25 wt %. In the case of these combinations, the conductive substance is not diffused into the support portion 12 or the surface portion 13, and remains stably in the dielectric electrode 15 during the manufacturing process, whereby such an electrode layer can be made low resistant. In addition, the carbon content in alumina in the electrode layer after being sintered can be set at 0.05 wt % or less, and accordingly, even if the surface portion 13 made of yttria ceramics and the intermediate ceramic layer 14 are formed, and the electrode is interposed between the surface portion 13 and the support portion 12, the surface portion 13 and the support portion 12 can be bonded firmly to each other.

Note that, preferably, before forming the dielectric electrode 15, surface treatment such as grinding and polishing is implemented for the surface of the alumina member 121, on which the dielectric electrode is to be formed, and a smooth surface with flatness of 10 µm or less is formed thereon in advance.

Figure 5C:
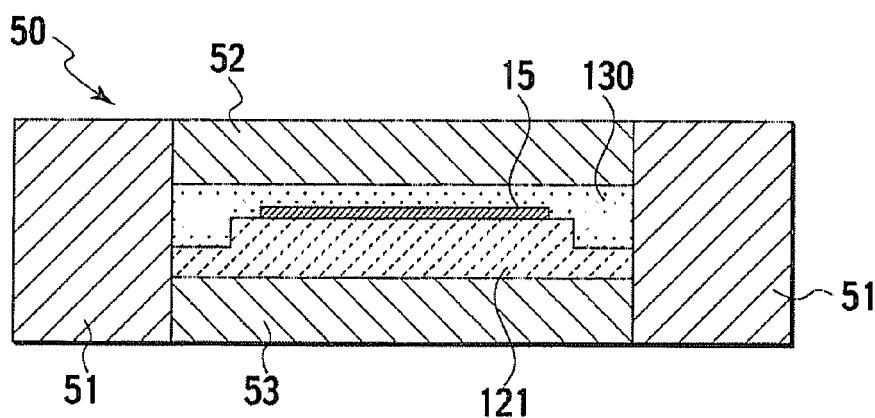

Next, as shown in FIG. 5C, an yttria molded body 130 is formed on the alumina member 121 and the dielectric electrode 15 formed on the alumina member 121. In order to form the yttria molded body 130, first, a binder, water, a dispersant, and the like are added to raw material powder of yttria ceramics, followed by mixing, and slurry of the raw material is prepared.

The slurry of the raw material is sprayed and dried, or granulated by a granulation method and the like, and powder or granules are obtained. It is preferable that the powder or granules thus obtained be calcined at 400° C. or more in the oxidation atmosphere. The powder or the granules are calcined, whereby moisture and carbon in the yttria powder, which hinder the sintering of yttria, can be removed. Therefore, a time of the sintering for obtaining a sintered body of yttria can be shortened, and a temperature at the sintering can be lowered. In addition, a denser sintered body of yttria can be obtained. As a result, excessive grain growth of the sintered body of yttria can be prevented, and mechanical strength of the sintered body of yttria can be enhanced. Moreover, the sintered body of yttria can also be formed as a sintered body in which variations of a color tone are suppressed and color unevenness is inconspicuous. It is more preferable that the temporal firing temperature of the powder or granules of yttria be 500° C. to 1000° C.

Moreover, an amount of moisture contained in the calcined granules is 1% or less, whereby the sintering temperature at the sintering in the subsequent step can be lowered, and a denser sintered body of yttria with higher mechanical strength can be obtained. Moreover, oxidation of the dielectric electrode 15 can be prevented during the sintering. Furthermore, it is preferable that an average particle diameter of the yttria powder or the mixed powder thereof be 0.1 µm to 3.5 µm. Use of the calcined granules also brings effects that strength of the molded body, which is to be described later, is enhanced, and that it becomes easy to handle the molded body.

Note that, for the raw material powder, mixed powder and the like can be used, in which the yttria granules are added with alumina powder, silica powder, zirconia powder, silicon carbide powder, silicon nitride powder, and the like as a fortifier and sintering aids. The mixed powder as described above can enhance mechanical strength such as bending strength and fracture toughness of the surface portion 13 made of yttria ceramics. However, it is preferable that an amount of yttria contained in the raw material powder be 90 wt % or more. A more preferable amount of yttria is 99 wt % or more. Moreover, a purity of the yttria powder is preferably 99.5 wt % or more, more preferably, 99.9 wt % or more.

The yttria molded body 130 is molded from the above-described granulated granules or mixed powder. The yttria molded body 130 can be molded by being subjected to press molding together with the alumina member 121 by using a press metal mold in which the alumina member 121 is housed. By a longitudinal cross-sectional view, FIG. 5C shows an example where a metal mold 50 includes a side wall 51, an upper mold 52, and a lower mold 53, the alumina member 121 is housed in the metal mold 50, and the yttria molded body 130 is molded on the alumina member 121.

In the press molding by the metal mold 50, first, the alumina member 121 on which the dielectric electrode 15 is formed is mounted on an upper surface of the lower mold 53 of the metal mold 50 while orienting the surface of the alumina member 121, on which the dielectric electrode 15 is formed, in an upward direction. Subsequently, the above-described granules or mixed powder of yttria ceramics is charged into the metal mold so as to cover the alumina member 121 and the dielectric electrode 15. At this time, the powder of yttria ceramics is filled also into a cutaway portion formed on an upper circumferential edge portion of the alumina member 121.

Next, any one of the upper mold 52 and lower mold 53 of the metal mold 50 is operated toward the other, or both thereof are operated toward each other. Then, the powder of yttria ceramics is pressed together with the alumina member 121. By such pressing, the yttria molded body 130 is formed, and the yttria molded body 130, the alumina member 121, and the dielectric electrode 15 are integrated.

Figure 5D:
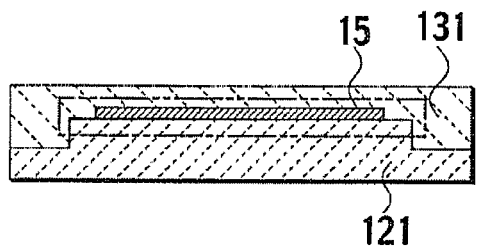

Next, as shown in FIG. 5D, the alumina member 121, the dielectric electrode 15, and the yttria molded body 130 are integrally fired, for example, by the hot press method, and a sintered body of the base material is obtained. By such sintering, the formation of the yttria sintered body 131 and the integration of the yttria sintered body 131 with the alumina member 121 and the dielectric electrode 15 are simultaneously performed. Moreover, by the hot-press sintering, the intermediate ceramic portion (not shown) is formed.

It is preferable that the above-described sintering be performed, for example, in the atmosphere of the inert gas such as nitrogen gas and argon gas while pressing the above-described molded body in the uniaxial direction. It is preferable that a firing temperature at the time of fabricating the integral sintered body, which is also a sintering temperature of the yttria molded body, be set at 1400° C. to 1800° C. A more preferable sintering temperature is 1600° C. to 1700° C. As described above, the integral sintered body is fabricated by the low temperature sintering, whereby this process prevents the excessive grain growth on the alumina sintered body 121 and the yttria sintered body 131 in the integral sintered body, and eventually, the mechanical strength of the base 11 can be enhanced.

Moreover, it is preferable that a temperature rise rate at the time of the sintering be 500° C./h to 1000° C./h at 1000° C. or less where densification of the integral sintered body is not started for the purpose of shortening the sintering time, and be 100° C./h to 300° C./h in a temperature range of more than 1000° C. Furthermore, it is preferable that the pressure to be applied to the integral sintered body be within a range of 50 kgf/cm² to 300 kgf/cm². If the pressure is within this range, then a denser yttria sintered body 131 can be obtained. More preferably, the pressure range is 100 kgf/cm² to 200 kgf/cm². Note that, when yttria powder that was not subjected to the calcining at 400° C. or more is used as the raw material powder of the yttria sintered body 131, the yttria powder may be held within a range of 400° C. to 1000° C. for a predetermined time in such a temperature rise process, and the moisture, carbon, and the like in the yttria powder may be removed therefrom.

Figure 5E:
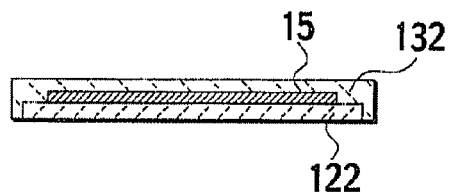

Next, a process is performed, which is to leave a range surrounded by a virtual line in FIG. 5D, and to remove the surface portion of the sintered body for the base material, and the base 11 as shown in FIG. 5E is formed. The above-described process can be a cutting process, a grinding process, or a combination of both thereof. Thereafter, a surface polishing process can be performed. As shown in FIG. 5E, the base 11 after being processed is formed into a shape in which a surface portion 132 (corresponding to the surface portion 13 of FIG. 1) that is made of yttria ceramics and is formed so as to cover a support portion 122 (corresponding to the support portion 12 of FIG. 1) made of alumina ceramics and to cover the electrode 15 forms the substrate mounting surface and side surface portion of the base. In this case, the dielectric layer has the predetermined thickness.

Figure 5F:
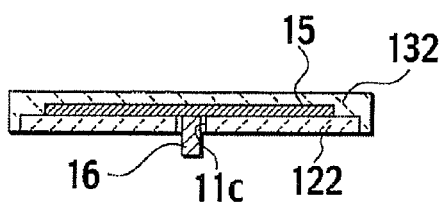

Next, as shown in FIG. 5F, a conductive hole is drilled in a back surface of the base, the terminal 16 is bonded to the dielectric electrode 15, and an electrostatic chuck in which the dielectric electrode 15 is embedded in the base is obtained. Specifically, in the electrostatic chuck, a thickness of the surface portion 132 formed of the yttria sintered body, which is a portion becoming the dielectric layer, is adjusted to 0.2 mm to 0.5 mm by the grinding process. Moreover, the centerline average surface roughness (Ra) of the substrate mounting surface is adjusted at 0.6 μm or less by the polishing process. Moreover, the hole for inserting the terminal 16 is formed by the drilling process. Then, the terminal 16 is inserted from the hole c, and the dielectric electrode 15 and the terminal 16 are bonded to each other by brazing or welding. In such a way, the electrostatic chuck 10 according to the present invention can be obtained.

In accordance with the manufacturing method shown in FIG. 5A to FIG. 5F, the surface portion 132 made of yttria ceramics can be formed not only on the substrate mounting surface of the base but also on the side surface thereof, and accordingly, the corrosion resistance of the electrostatic chuck can be enhanced. In the surface portion 132, the substrate mounting surface and side surface of the base are integrally molded and sintered by the hot press sintering. Accordingly, the process can be simplified more than in a method of forming yttria ceramics on the substrate mounting surface and the side surface in different steps.

Moreover, the substrate mounting surface and the side surface are molded seamlessly. Accordingly, the manufacturing method described above is superior in corrosion resistance to the case of individually forming the substrate mounting surface and side surface portion of the base and bonding both thereof by the adhesive.

Furthermore, the alumina member and the yttria molded body are integrally fired by using the hot press method, whereby the support portion 122 made of alumina ceramics and the surface portion 132 made of yttria ceramics can be bonded to each other without interposing the adhesive therebetween, and the intermediate ceramic layer that enhances the adhesion can be formed on the bonded interface therebetween. Hence, the dielectric electrode 15 can be shielded from the outer atmosphere, and the corrosion resistance of the electrostatic chuck can be enhanced. Moreover, the electrostatic chuck in which the support portion 122, the surface portion 132, and the dielectric electrode 15 are bonded firmly to one another can be obtained.

Moreover, the carbon contents in the raw material of alumina ceramics and the raw material of yttria ceramics are reduced to 0.05 wt % or less by the calcination. Accordingly, the carbon content in the support portion 12 of the electrostatic chuck can be reduced, and hence, the leak current can be suppressed, and the firm and dense surface corrosion-resistant layer can be formed.

Next, a description will be made of another example of the manufacturing method of the electrostatic chuck according to the present invention by using FIG. 6A to FIG. 6F. FIG. 6A to FIG. 6F are time-series process views of the manufacturing method of an electrostatic chuck. The electrostatic chuck to be manufactured by steps shown in these drawings is an electrostatic chuck with a heater, which includes the resistance heating body 17 as well as the dielectric electrode 15 in the inside of the base 11. Here, a final form of the electrostatic chuck is as shown in FIG. 6F. More specifically, a surface portion 232 made of yttria ceramics is formed so as not only to cover an upper surface and side surface of a support portion 221 made of alumina ceramics but also to cover a lower surface thereof. In such a way, the surface portion 232 forms the substrate mounting surface 11a, back surface 11b and side surface 11d of the base 11. The dielectric electrode 15 is formed between the support portion 221 and the surface portion 232. The terminal 16 is provided so as to be connected to the dielectric electrode 15. Moreover, the resistance heating body 17 is formed in contact with the support portion 221, and the terminals 18 are connected to the resistance heating body 17.

Figure 6A:
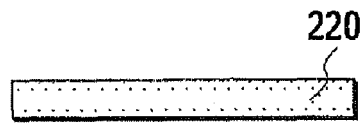
FIGS. 6A to 6F are process views of another example of the manufacturing method according to the present invention.

In order to manufacture the electrostatic chuck with a heater, first, as shown in FIG. 6A, a plate like alumina member 220 that becomes the support portion is manufactured. The alumina member 220 does not have the cutaway portion on the upper circumferential edge portion, which is owned by the alumina members 120 and 121 shown in FIG. 5A and FIG. 5B. However, the alumina member 220 is manufactured in such a manner that the same raw material as that of the alumina member 121 shown in FIG. 5 is subjected to the hot-press sintering by the same manufacturing method as that for the alumina member 121, but by using a different metal mold, followed by sintering.

Figure 6B:
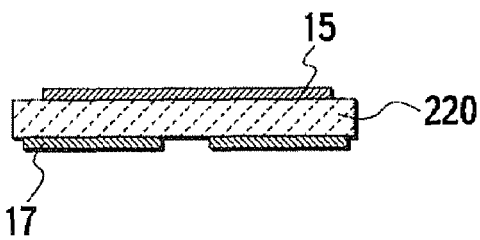

Next, as shown in FIG. 6B, the dielectric electrode 15 is formed on one surface of the alumina member 221 as a sintered body. The formation of the dielectric electrode 15 can be performed by the same step as the manufacturing step of the dielectric electrode in the manufacturing method described by using FIG. 5B.

Moreover, the resistance heating body 17 is formed on a surface of the alumina member 221, which is opposite side of the surface on which the dielectric electrode 15 is formed. The resistance heating body 17 can be formed of a material similar to that of the dielectric electrode 15.

Figure 6C:
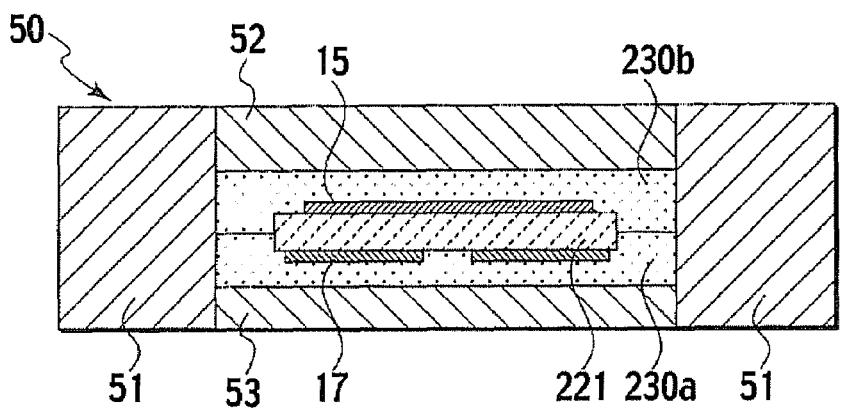

Next, as shown in FIG. 6C, a yttria molded body is formed on the periphery of the alumina member 221 on which the resistance heating body 17 and the dielectric electrode 15 are formed. The yttria molded body can be formed by using the metal mold 50. The metal mold 50 includes the side wall 51, the upper mold 52, and the lower mold 53. Powder of yttria ceramics, which is similar to that described by using FIG. 5C, is charged onto the lower mold 53, and an yttria molded body 230a as a lower half is subjected to the press molding. The obtained yttria molded body 230a is formed into a shape having, on an upper support portion thereof, a recessed portion fitted to an outer shape of the alumina member 221. In order to perform the press molding for the powder into such a shape, for example, there is a method in which a model of the lower half of the alumina member 221 is prepared, the model is mounted on the powder of yttria ceramics in the metal mold, and the powder is subjected to the press molding together with the model. Moreover, there is also a method in which the powder of yttria ceramics is subjected to the press molding so that an upper surface thereof can be a flat surface, the upper support portion of a molded body thus obtained is thereafter removed, and the recessed portion is formed. Furthermore, there is also a method in which the powder of yttria ceramics is charged into the metal mold, the alumina member 221 is thereafter mounted on the yttria powder, powder of yttria is thereafter charged into the metal mold so as to cover the alumina member 221, and the press molding that follows is performed, whereby the powder of yttria as the lower half is pressed by the alumina member 221, and the above-described recessed portion is formed in the molded yttria powder.

Next, the alumina member 221 is mounted on the upper support portion of the yttria molded body 230a in which the upper support portion is molded in to the recessed form. In an example shown in FIG. 6C, the alumina member 221 is mounted so that the surface thereof on which the resistance heating body 17 is formed can be oriented downward and can be opposite to the lower half yttria molded body 230a. However, the orientation of the alumina member 221 is not limited to the example shown in FIG. 6C. The alumina member 221 may be mounted so that the surface thereof on which the dielectric electrode 15 is formed can be opposite to the lower half yttria molded body 230a.

Next, powder or granules of yttria ceramics, which are made of the same material as that of the lower half yttria molded body 230a, are charged so as to cover the alumina member 221 and the lower half yttria molded body 230a in the same metal mold 50. After the powder or the granules are charged, any one of the upper mold 52 and lower mold 53 of the metal mold 50 is pressed toward the other, or both thereof are pressed toward each other, and the powder or granules of yttria ceramics are pressed. By such pressing, an yttria molded body 230b as an upper half is formed, and the yttria molded body 230b and the alumina member 221 are integrated.

Figure 6D:
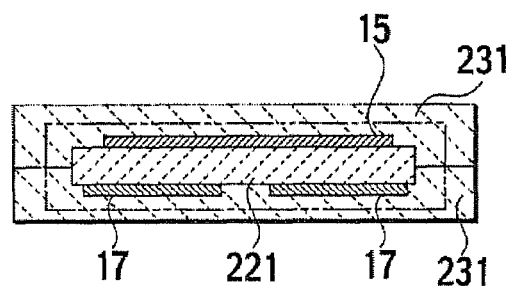

Next, as shown in FIG. 6D, the alumina member 221, the dielectric electrode 15, the resistance heating body 17, and the yttria molded bodies 230a and 230b are integrally sintered, for example, by the hot press method. In such a way, a sintered body of the base material is obtained, in which the yttria molded bodies 230a and 230b are individually converted into yttria sintered bodies 231, and the yttria sintered bodies 231 are bonded to and integrated with the alumina member 221, and the dielectric electrode 15 or the resistance heating body 17. By such sintering, the formation of the yttria sintered bodies 231 and the integration of the yttria sintered bodies 231 with the alumina member 221, the dielectric electrode 15 and the resistance heating body 17 are performed simultaneously. Moreover, by such sintering, the intermediate ceramic portion (not shown) is formed. For conditions of the sintering, for example, the same conditions as in the manufacturing method already described by using FIG. 5D can be used.

Figure 6E:
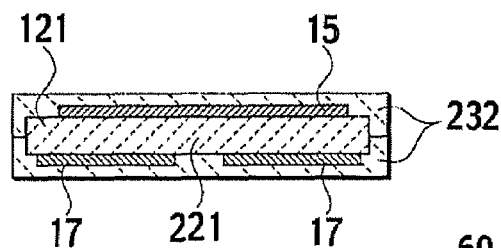
Figure 6F:
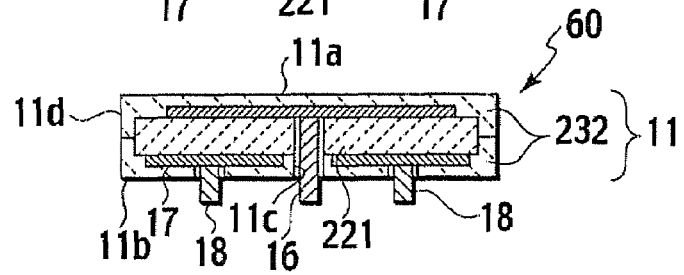

Next, a process is performed, which is to leave a range surrounded by a virtual line in FIG. 6D, and to remove the surface portion of the sintered body for the base material, and the base 11 as shown in FIG. 6E is formed. The above-described process can be a cutting process, a grinding process, or a combination of both thereof. Thereafter, a surface polishing process can be performed. As shown in FIG. 6E, the base 11 after being processed is formed into a shape in which the support portion 221 (corresponding to the support portion of the base) made of alumina ceramics and a surface portion 232 (corresponding to the surface portion 13 of the base) that is made of yttria ceramics and is formed so as to cover the electrode 15 and the resistance heating body 17. The substrate mounting surface, side surface portion and back surface of the base 11 are processed. In this case, the dielectric layer has the predetermined thickness. Moreover, the resistance heating body 17 is embedded in the base 11.

Next, as shown in FIG. 6F, a conductive hole is drilled in the back surface of the base, and the terminal 16 is bonded to the dielectric electrode 15, and in addition, the heater terminals 18 are bonded to the resistance heating body 17, and an electrostatic chuck 60 in which the dielectric electrode 15 and the resistance heating body 17 are embedded in the base is obtained. Specifically, in the electrostatic chuck, a thickness of the yttria dielectric layer at 11a is adjusted to 0.2 mm to 0.5 mm by the grinding process. Moreover, the centerline average surface roughness (Ra) of the substrate mounting surface 11a is adjusted at 0.6 μm or less by the polishing process. Moreover, the holes 11c for inserting the terminal 16 or the terminals 18 are formed by the drilling process. Then, the terminal 16 and the terminals 18 are individually inserted from the holes 11c, and the dielectric electrode 15 and the terminal 16 are bonded to each other by brazing or welding. In such a way, the electrostatic chuck 60 according to the present, invention can be obtained.

In accordance with the manufacturing method shown in FIG. 6A to FIG. 6F, similar effects to those of the manufacturing method described by using FIG. 5A to FIG. 5F can be obtained. In addition to these effects, in the manufacturing method shown in FIG. 6A to FIG. 6F, the electrostatic chuck in which the surface portion made of yttria ceramics having high corrosion resistance is formed so as to cover the entire surface 9 of the support portion made of alumina ceramics can be manufactured easily. Moreover, the resistance heating body 17 can be manufactured so as to be located between the support portion made of alumina ceramics and the surface portion made of yttria ceramics, and accordingly, the manufacturing process can be simplified more than in a manufacturing method in which the resistance heating body is formed in the inside of the support portion or in the inside of the surface portion. Furthermore, in accordance with the manufacturing method, a structure is formed, in which alumina ceramics is sandwiched from both of upper and lower surfaces thereof by the pieces of yttria ceramics. Accordingly, even if there is a difference in coefficient of thermal expansion between alumina and yttria, residual stresses occur uniformly on upper and lower interfaces in a diameter direction and balance with each other. Therefore, a structure with higher reliability can be obtained.

Note that, for the manufacturing methods shown in FIG. 5A to FIG. 5F and FIG. 6A to FIG. 6F, may be modified as long as the modifications are incorporated in the scope of the present invention. For example, in the manufacturing method shown in FIG. 6A to FIG. 6F, as shown in FIG. 6D, the process to remove the surface portion of the sintered body of the base material after the sintering is performed in the above description. However, if the shape of the sintered body of the base material is substantially the same as the shape of the base in terms of dimension, then the above-described process to remove a large amount of the surface portion of the sintered body of the base material after the sintering can be omitted.

Moreover, as shown in FIG. 2 and FIG. 4, in the case of manufacturing the electrostatic chuck, in which the resistance heating body 17 is embedded in the support portion 12 made of alumina ceramics, and the support portion 12 is formed of two portions different in carbon content from each other, the two portions being: the upper portion 12a in contact with the dielectric electrode 15; and the lower portion 12b located on the periphery of the resistance heating body, then the alumina sintered body that becomes the support portion 12 can be fabricated in the following way.

First, after the organic binder and the like are added to the raw material powder of alumina ceramics, slurry of the raw material is prepared, and is granulated by the spray dryer or the like, and alumina granules are prepared. A carbon amount of the granules is set at 0.2 wt % to 1.8 wt %. Next, a predetermined amount of the granules is calcined, and calcined granulated powder is prepared. In such a way, two types are prepared, which are: the granules with a high carbon content without calcination; and the calcined granulated powder with a low carbon content.

The above-described granules are charged into the metal mold, and a coil-like resistance heating element (resistance heating body) containing Nb is placed on the granules. Thereafter, the above-described granules are charged again so as to cover the periphery of the resistance heating element, and a resultant is then pressed by the upper mold and lower mold of the metal mold. In such a way, a molded body of a portion that becomes the lower portion 12b of the support portion 12 is fabricated.

The above described calcined granulated powder is charged onto the molded body fabricated in the metal mold, and is then subjected to the press molding. Such a molded body of the calcined granulated powder becomes a portion of the upper portion 12a of the support portion 12. The molded bodies of the portions of the upper portion 12a and lower portion 12b of the support portion 12, which are molded as described above, are integrally subjected to the hot pressing, whereby a substantially disc-like alumina sintered body is obtained, in which the heater (resistance heating element) is embedded in the inside of the lower portion 12b of the support portion 12.

In the alumina sintered body thus obtained, a carbon amount of the portion that becomes the lower portion 12b of the support portion 12 becomes 0.05 wt % to 0.25 wt %, and a carbon amount of the portion that becomes the upper portion 12a of the support portion 12 becomes 0.05 wt % or less. After the surface on the upper portion 12a side of the alumina sintered body is ground, the dielectric electrode 15 is formed on the surface.

The formation of the dielectric electrode 15, the subsequent formation of the surface portion made of yttria ceramics, and the like just need to be performed in accordance with the methods already mentioned above.

EXAMPLES

By examples, a description will be more specifically made of the electrostatic chuck and the manufacturing method thereof according to the present invention. Note that the electrostatic chuck and the manufacturing method thereof according to the present invention are not limited to the examples to be described below at all.

Example 1

Example 1 is an example of manufacturing the electrostatic chuck shown in FIG. 3 in accordance with the steps shown in FIG. 5A to FIG. 5F.

As the raw material powder of the alumina sintered body, alumina powder with a purity of 99.9 wt % and an average particle diameter of 0.5 μm was prepared. To the alumina powder, there were added water, a dispersant, and polyvinyl alcohol (PVA) as a binder. Then, a resultant was mixed by a trommel for 16 hours, and raw material slurry was prepared. The obtained raw material slurry was shifted through a sieve with an aperture of 20 μm, and impurities were removed therefrom. Then, the slurry was sprayed and dried by using the spray dryer, and granules of alumina with an average particle diameter of approximately 80 μm were prepared. The granules thus obtained were calcined at 500° C. in an atmospheric pressure oxidation furnace.

Next, the granules of alumina were filled into the metal mold, and were pressed with 50 kgf/cm² by a uniaxial press machine, and an alumina molded body was fabricated. The obtained alumina molded body was loaded into a carbon made sheath, and was fired by a hot press machine, in a nitrogen atmosphere, the alumina molded body was heated up from room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for two hours. Then, the sintered alumina body was cut into the shape having the cutaway portion on the upper circumferential edge portion.

Next, ethyl cellulose was mixed as a binder with mixed powder of 80 vol % tungsten carbide and 20 vol % alumina powder, and a paste was prepared. Moreover, the grinding process was implemented for a surface of the alumina sintered body, on which the dielectric electrode is to be formed, and a smooth surface with flatness of 10 μm or less was formed. On the smooth surface of the alumina sintered body, the dielectric electrode with a diameter of 290 mm and a thickness of 20 μm was formed by the screen printing method using the paste, followed by drying.

Next, yttria powder with a purity of 99.9 wt % and an average particle diameter of 1 μm was prepared. To the yttria powder, there were added water, a dispersant, and polyvinyl alcohol (PVA) as a binder. Then, a resultant was mixed by the trommel for 16 hours, and raw material slurry was prepared. The obtained raw material slurry was shifted through the sieve with an aperture of 20 µm, and impurities were removed. Then, the slurry was sprayed and dried by using the spray dryer, and granules of yttria with an average granule diameter of approximately 80 µm were prepared. The granules thus obtained were calcined at 500° C. in the atmospheric pressure oxidation furnace, and a moisture amount contained therein was adjusted at 1% or less.

Then, the alumina sintered body on which the above-described dielectric electrode was formed was set in the metal mold. The above described granules of yttria were filled onto the alumina sintered body and the dielectric electrode, and were subjected to the press molding by being pressed with 50 kgf/cm² by the uniaxial press machine. In such a way, an yttria molded body was formed.

Then, the alumina sintered body, the dielectric electrode, and the yttria molded body, which were molded integrally, were set into the carbon-made sheath, and were fired by the hot press method. Specifically, the alumina sintered body, the dielectric electrode, and the yttria molded body were fired in a nitrogen pressurized atmosphere (nitrogen: 150 kPa) while being pressed with 100 kgf/cm². The alumina sintered body, the dielectric electrode, and the yttria molded body were fired in the following way. The alumina sintered body, the dielectric electrode, and the yttria molded body were heated up from the room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for two hours.

For such an integral sintered body of the alumina sintered body, the dielectric electrode, and the yttria molded body, which was obtained as described above, a process to remove a surface portion thereof was performed. This process was performed by a grinding process using a diamond grindstone, and by this process, a substrate shape was obtained, in which the substrate mounting surface and side surface of the base were formed of the surface portion made of yttria ceramics.

Moreover, a flat surface grinding process was performed for the surface of the sintered body by the diamond grindstone, and a thickness (distance between the dielectric electrode and the substrate mounting surface) of the yttria sintered body that becomes the dielectric layer was set at 0.35±0.05 mm. Furthermore, the side surface and bottom surface of the integral sintered body was ground, and a thickness of the electrostatic chuck was set at 3 mm. A drilling process for inserting the terminal into the alumina sintered body of the base was performed, the terminal was brazed to the dielectric electrode, and the electrostatic chuck was obtained.

Example 2

Example 2 is an example of manufacturing the electrostatic chuck with a heater in accordance with the steps shown in FIG. 6A to FIG. 5F.

As the raw material powder of the alumina sintered body, alumina powder with a purity of 99.9 wt % and an average particle diameter of 0.5 µm was prepared. To the alumina powder, there were added water, a dispersant, and polyvinyl alcohol (PVA) as a binder. Then, a resultant was mixed by the trommel for 16 hours, and raw material slurry was prepared. The obtained raw material slurry was shifted through the sieve with an aperture of 20 µm, and impurities were removed. Then, the slurry was sprayed and dried by using the spray dryer, and granules of alumina with an average particle diameter of approximately 80 µm were prepared. The granules thus obtained were calcined at 500° C. in the atmospheric pressure oxidation furnace.

Next, the granules of alumina were filled into the metal mold, and were pressed with 50 kgf/cm² by the uniaxial press machine, and a plate-like alumina molded body was fabricated. The obtained alumina molded body was loaded into the carbon-made sheath, and was fired by the hot press machine, and an alumina sintered body was obtained. Specifically, the alumina molded body was fired in the following way. In the nitrogen atmosphere, the alumina molded body was heated up from the room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for two hours.

Next, ethyl cellulose was mixed as a binder with mixed powder of 80 vol % tungsten carbide and 20 vol % alumina powder, and a paste was prepared. Moreover, the grinding process was implemented for a surface of the alumina sintered body, on which the dielectric electrode is to be formed, and a smooth surface with flatness of 10 µm or less was formed. On the smooth surface of the alumina sintered body, the dielectric electrode with a diameter of 290 mm and a thickness of 20 µm was formed by the screen printing method using the paste, followed by drying.

Moreover, on a surface of the alumina sintered body, which is opposite side of the surface on which the above-described dielectric electrode was formed, a resistance heating body was formed by the screen printing method using the above-described paste, followed by drying.

Next, as the raw material powder of the yttria sintered body, yttria powder with a purity of 99.9 wt % and an average particle diameter of 1 µm was prepared. To the yttria powder, there were added water, a dispersant, and polyvinyl alcohol (PVA) as a binder. Then, a resultant was mixed by the trommel for 16 hours, and raw material slurry was prepared. The obtained raw material slurry was shifted through the sieve with an aperture of 20 µm, and impurities were removed. Then, the slurry was sprayed and dried by using the spray dryer, and granules of yttria with an average particle diameter of approximately 80 µm were prepared. The granules thus obtained were calcined at 500° C. in the atmospheric pressure oxidation furnace, and a moisture amount, contained therein was adjusted at 1% or less.

The granulated granules of yttria were filled into the metal mold, and were pressed with 50 kgf/cm² by the uniaxial press machine, and an yttria molded body was fabricated.

Then, the alumina sintered body, the dielectric electrode, and the yttria molded body, which were molded integrally, were set into the carbon-made sheath, and were fired by the hot press method. Specifically, the alumina sintered body, the dielectric electrode, and the yttria molded body were fired in a nitrogen pressurized atmosphere (nitrogen: 150 kPa) while being pressed with 100 kgf/cm². The alumina sintered body, the dielectric electrode, and the yttria molded body were fired in the following way. The alumina sintered body, the dielectric electrode, and the yttria molded body were heated up from the room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for two hours.

Such an integral sintered body of the alumina sintered body, the dielectric electrode, and the yttria molded body, which was obtained as described above, was processed. Such a process was performed by the grinding process, and by this process, a substrate shape was obtained, in which the substrate mounting surface, side surface and back surface of the base were formed of the surface portion made of yttria ceramics.

Moreover, a flat surface grinding process was performed for the surface of the sintered body by the diamond grindstone, and a thickness (distance between the dielectric electrode and the substrate mounting surface) of the yttria sintered body that becomes the dielectric layer was set at 0.35±0.05 mm. Furthermore, the side surface and bottom surface of the integral sintered body was ground, and a thickness of the electrostatic chuck was set at 5.5 mm. A drilling process for inserting the terminal into the alumina sintered body of the base was performed, the terminal was brazed to the dielectric electrode, and the electrostatic chuck was obtained.

Comparative Example 1

Comparative example 1 is an example of fabricating the yttria sintered body before fabricating the alumina molded body.

As the raw material powder of the yttria sintered body, yttria powder with a purity of 99.9 wt % and an average particle diameter of 1 µm was prepared. To the yttria powder, there were added water, a dispersant, and polyvinyl alcohol (PVA) as a binder. Then, a resultant was mixed by the trommel for 16 hours, and slurry was prepared.

The obtained slurry was shifted through the sieve with an aperture of 20 µm, and impurities were removed. Then, the slurry was sprayed and dried by using the spray dryer, and granules of yttria with an average granule diameter of approximately 80 µm were prepared. The granules thus obtained were temporarily fired at 500° C. in the atmospheric pressure oxidation furnace, and a moisture amount contained therein was adjusted at 1% or less.

The granules of yttria were filled into the metal mold, and were pressed with 50 kgf/cm$^2$ by the uniaxial press machine, and an yttria molded body with such a shape that is plate-like and has a recessed portion on a support portion thereof, the shape corresponding to the surface portion of FIG. 1, was fabricated. The yttria molded body thus fabricated was loaded into the carbon-made sheath, and was fired by the hot press machine, and an yttria sintered body was formed. Specifically, the yttria molded body was fired in the nitrogen pressurized atmosphere (nitrogen: 150 kPa) while being pressed with 100 kgf/cm$^2$. The yttria molded body was fired in such a way that the yttria molded body was heated up from the room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for four hours.

Next, ethyl cellulose was mixed as a binder with mixed powder of 80 vol % tungsten carbide and 20 vol % alumina powder, and a printing paste was prepared. Moreover, the grinding process was implemented for a surface (bottom surface of the recessed portion) of the yttria sintered body, on which the dielectric electrode is to be formed, and a smooth surface with flatness of 10 µm or less was formed. On the smooth surface of the yttria sintered body, the dielectric electrode with a diameter of 290 mm and a thickness of 20 µm was formed by the screen printing method using the paste, followed by drying.

Next, as the raw material powder of the alumina sintered body, alumina powder with a purity of 99.9 wt % and an average particle diameter of 0.5 µm was prepared. To the alumina powder, there were added water, a dispersant, and polyvinyl alcohol (PVA) as a binder. Then, a resultant was mixed by the trommel for 16 hours, and slurry was prepared. The obtained slurry was shifted through the sieve with an aperture of 20 µm, and impurities were removed. Then, the slurry was sprayed and dried by using the spray dryer, and granules of alumina with an average granule diameter of approximately 80 µm were prepared.

The yttria sintered body on which the dielectric electrode was formed was set in the metal mold of the uniaxial press machine so that the recessed portion of a support portion of the yttria sintered body could be oriented upward. Then, the prepared granules of alumina were filled onto the recessed portion of the yttria sintered body and the dielectric electrode, and were subjected to the press molding by being pressed with 50 kgf/cm$^2$. In such a way, an alumina molded body was formed.

Then, the yttria sintered body, the dielectric electrode, and the alumina molded body, which were molded integrally, were set into the carbon-made sheath, and were fired by the hot press method. Specifically, the yttria sintered body, the dielectric electrode, and the alumina molded body were fired in the nitrogen pressurized atmosphere (nitrogen: 150 kPa) while being pressed with 100 kgf/cm$^2$. The yttria sintered body, the dielectric electrode, and the alumina molded body were fired in such a way that the yttria sintered body, the dielectric electrode, and the alumina molded body were heated up from the room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for two hours.

Such an integral sintered body of the alumina molded body, the dielectric electrode, and the yttria molded body, which was obtained as described above, was observed in detail. Then, microcracks occurred in the portion of yttria.

Example 3

Example 3 is an example of manufacturing the electrostatic chuck with a heater, which is shown in FIG. 4.

As the raw material powder of the alumina sintered body, alumina powder with a purity of 99.9 wt % and an average particle diameter of 0.5 µm was prepared. To the alumina powder, there were added water, a dispersant, and polyvinyl alcohol (PVA) as a binder. Then, a resultant was mixed by the trommel for 16 hours, and raw material slurry was prepared. The obtained raw material slurry was shifted through the sieve with an aperture of 20 µm, and impurities were removed. Then, the slurry was sprayed and dried by using the spray dryer, and granules of alumina with an average granule diameter of approximately 80 µm were prepared. A carbon amount of the obtained granules was 1.2 wt % to 1.8 wt %.

Next, a part of the obtained granules was separated by a predetermined amount, and the predetermined amount of the granules was calcined at 500° C. in the atmospheric pressure oxidation furnace. In such a way, two types were prepared, which are: the granules with a high carbon content without calcination; and the calcined granulated powder with a low carbon content.

Next, a predetermined amount of the above described granules of alumina with a high carbon content was charged into the metal mold, and a coil like resistance heating body containing Nb was placed on the granules. Thereafter, a predetermined amount of the granules was charged onto the granules of alumina and the coil-like resistance heating body so as to cover the resistance heating body. Thereafter, a resultant was pressed with 50 kgf/cm$^2$ by the uniaxial press machine, and a molded body of a portion corresponding to the lower portion of the support portion of the base was fabricated.

Subsequently, the above-described calcined granulated powder with a low carbon content, was charged onto the molded body in the same metal mold, and was pressed with 50 kgf/cm$^2$ by the uniaxial press machine. In such a way, a plate-like alumina molded body was fabricated, in which a portion corresponding to the upper portion of the support portion was integrally molded on the above-described molded body of the portion corresponding to the lower portion of the support, portion of the base. The obtained alumina molded body was loaded into the carbon-made sheath, and was fired by the hot press machine, and an alumina sintered body was obtained. Specifically, the alumina molded body was fired in such a way that, in the nitrogen atmosphere, the alumina molded body was heated up from the room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for two hours.

Next, ethyl cellulose was mixed as a binder with mixed powder of 80 vol % tungsten carbide and 20 vol % alumina power, and a paste was prepared. Moreover, the grinding process was implemented for a surface of the alumina sintered body, on which the dielectric electrode is to be formed, and a smooth surface with flatness of 10 µm or less was formed. On the smooth surface of the alumina sintered body, the dielectric electrode with a diameter of 290 mm and a thickness of 20 µm was formed by the screen printing method using the paste, followed by drying.

Next, as the raw material powder of the yttria sintered body, yttria powder with a purity of 99.9 wt % and an average particle diameter of 1 µm was prepared. To the yttria powder, there were added water, a dispersant, and polyvinyl alcohol (PVA) as a binder. Then, a resultant was mixed by the trommel for 16 hours, and raw material slurry was prepared. The obtained raw material slurry was shifted through the sieve with an aperture of 20 µm, and impurities were removed. Then, the slurry was sprayed and dried by using the spray dryer, and granules of yttria with an average granule diameter of approximately 80 µm were prepared. The granules thus obtained were temporarily fired at 500° C. in the atmospheric pressure oxidation furnace, and a moisture amount, contained therein was adjusted at 1% or less.

Then, the alumina sintered body on which the above-described dielectric electrode was formed was set in the metal mold. The prepared granulated granules of yttria were filled onto the alumina sintered body and the dielectric electrode, and were subjected to the press molding by being pressed with 50 kgf/cm$^2$ by the uniaxial press machine. In such a way, an yttria molded body was formed.

Then, the alumina sintered body, the dielectric electrode, and the yttria molded body, which were molded integrally, were set into the carbon made sheath, and were fired by the hot, press method. Specifically, the alumina sintered body, the dielectric electrode, and the yttria molded body were fired in the nitrogen pressurized atmosphere (nitrogen: 150 kPa) while being pressed with 100 kgf/cm$^2$. The alumina sintered body, the dielectric electrode, and the yttria molded body were fired in the following way. The alumina sintered body, the dielectric electrode, and the yttria molded body were heated up from the room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for two hours.

An integral sintered body of the alumina molded body, the dielectric electrode and the yttria molded body, which was obtained as described above, was processed. This process was performed by the grinding process, and by this process, a substrate shape was obtained, in which the substrate mounting surface, side surface and back surface of the base were formed of the surface portion made of yttria ceramics.

Moreover, a flat surface grinding process was performed for the surface of the sintered body by the diamond grindstone, and a thickness (distance between the dielectric electrode and the substrate mounting surface) of the yttria sintered body that becomes the dielectric layer was set at 0.35±0.05 mm. Furthermore, the side surface and bottom surface of the integral sintered body was ground, and a thickness of the electrostatic chuck was set at 5.5 mm. A drilling process for inserting the terminal into the alumina sintered body of the base was performed, the terminal was brazed to the dielectric electrode, and the electrostatic chuck was obtained.

Example 4

Example 4 is an example of an electrostatic chuck manufactured in accordance with similar steps to those of Example 1, in which yttria ceramics is formed only on the substrate mounting surface of the base, and is not formed oil the side surface of the base.

As the raw material powder of the alumina sintered body, alumina powder with a purity of 99.9 wt % and an average particle diameter of 0.5 µm was prepared. To the alumina powder, there were added water, a dispersant, and polyvinyl alcohol (PVA) as a binder. Then, a resultant was mixed by the trommel for 16 hours, and raw material slurry was prepared. The obtained raw material slurry was shifted through the sieve with an aperture of 20 µm, and impurities were removed. Then, the slurry was sprayed and dried by using the spray dryer, and granules of alumina with an average granule diameter of approximately 80 µm were prepared. The granules thus obtained were calcined at 500° C. in the atmospheric pressure oxidation furnace.

Next, the granules of alumina were filled into the metal mold, and were pressed with 50 kgf/cm$^2$ by the uniaxial press machine, and a plate-like alumina molded body was fabricated. A diameter of the alumina molded body was set at a diameter larger than the diameter of the base in consideration for shrinkage thereof at the time of the sintering in the subsequent step. The obtained alumina molded body was loaded into the carbon-made sheath, and was fired by the hot press machine, and an alumina sintered body was obtained. Specifically, the alumina molded body was fired in such a way that, in the nitrogen atmosphere, the alumina molded body was heated up from the room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for two hours.

Next, a paste was prepared in a similar way to Example 1, the grinding process was implemented for a surface of the alumina sintered body, on which the dielectric electrode is to be formed, and a smooth surface with flatness of 10 µm or less was formed. On the smooth surface of the alumina sintered body, the dielectric electrode with a diameter of 290 mm and a thickness of 30 µm was formed by the screen printing method, followed by drying.

Next, as the raw material powder of the yttria sintered body, yttria powder with a purity of 99.9 wt % and an average particle diameter of 1 µm was prepared. To the yttria powder, there were added water, a dispersant, and polyvinyl alcohol (PVA) as a binder. Then, a resultant was mixed by the trommel for 16 hours, and raw material slurry was prepared. The obtained raw material slurry was shifted through the sieve with an aperture of 20 μm, and impurities were removed. Then, the slurry was sprayed and dried by using the spray dryer, and granules of yttria with an average granule diameter of approximately 80 μm were prepared. The granules thus obtained were calcined at 500° C. in the atmospheric pressure oxidation furnace, and a moisture amount contained therein was adjusted at 1% or less.

Then, the alumina sintered body on which the dielectric electrode was formed was set in the metal mold. The granulated granules of yttria, which were prepared as described above, were filled onto the alumina sintered body and the dielectric electrode, and were subjected to the press molding by being pressed with 50 kgf/cm² by the uniaxial press machine. In such a way, an yttria molded body was fabricated.

Then, the alumina sintered body, the dielectric electrode, and the yttria molded body, which were molded integrally, were set into the carbon made sheath, and were fired by the hot press method. Specifically, the alumina sintered body, the dielectric electrode, and the yttria molded body were fired in the nitrogen pressurized atmosphere (nitrogen: 150 kPa) while being pressed with 100 kgf/cm². The alumina sintered body, the dielectric electrode, and the yttria molded body were heated up from the room temperature to 500° C. at a rate of 500° C./h, held at 500° C. for one hour, heated up from 500° C. to 1000° C. at a rate of 500° C./h, held at 1000° C. for one hour, heated up from 1000° C. to 1600° C. at a rate of 200° C./hour, and held at 1600° C. for two hours. The integral sintered body of the alumina molded body, the dielectric electrode and the yttria molded body, which was obtained as described above, was processed in a similar way to Example 1.

Furthermore, a drilling process for inserting the terminal into the alumina sintered body of the base was performed, the terminal was brazed to the dielectric electrode, and the electrostatic chuck was obtained.

[Evaluation 1]

For each of the electrostatic chuck obtained in accordance with Examples 1 to 4 and Comparative example 1, an influence of the carbon content in alumina ceramics, which is given to bonding strength between the support portion and surface portion of the base, was investigated. For this investigation, samples of bonded bodies were fabricated, which correspond to bonded bodies of the alumina sintered bodies and the yttria sintered bodies in the electrostatic chucks of Examples 1 to 4 and Comparative example 1. When the samples of the bonded bodies were fabricated, the contents of carbon contained in the granules of alumina were variously changed, whereby the carbon contents of the alumina sintered bodies were variously changed within a range of 0.01 wt % to 0.5 wt %.

Stick-like test pieces, each of which includes the bonded interface between the surface portion and the support portion, were cut out from the obtained samples of the bonded bodies in the thickness direction. Each test piece is columnar, and has an axial length of 20 mm and a diameter of 9.9 mm. Moreover, the bonded surface is located on a center of the length of 20 mm in the test piece. Shear strength of each test piece was investigated. Results of the investigation are shown in Table 1.

TABLE 1

| | C amount in alumina sintered body (wt %) | Shear strength of $Al_2O_3/Y_2O_3$ interface (MPa) | Broken portion | Interface peeling in processing | Intermediate layer on $Al_2O_3/Y_2O_3$ interface |
|---|---|---|---|---|---|
| Test Piece 1 | 0.5 | 24 | $Al_2O_3/Y_2O_3$ interface | Present | None |
| Test Piece 2 | 0.2 | 40 | $Al_2O_3/Y_2O_3$ interface | Present | None |
| Test Piece 3 | 0.1 | 72 | $Al_2O_3/Y_2O_3$ interface | Partially present | YAG |
| Test Piece 4 | 0.05 | 125 | $Y_2O_3$ interior | None | YAG YAM |
| Test Piece 5 | 0.04 | 123 | $Y_2O_3$ interior | None | YAG YAM |
| Test Piece 6 | 0.02 | 129 | $Y_2O_3$ interior | None | YAG YAM |
| Test Piece 7 | <0.01 | 127 | $Y_2O_3$ interior | None | YAG YAM |

As apparent from Table 1, in an example where the carbon content in the alumina sintered body is 0.05 wt % or less, the shear strength is high, and a fracture occurs not in the bonded interface but in the inside of yttria. Moreover, also at the time of the process, interface peeling did not occur on the bonded interface. As opposed to this, in an example where the carbon content exceeds 0.05 wt %, the shear strength is lower than in the example where the carbon content is 0.05 wt % or less, and the fracture occurred in the bonded interface. Moreover, the interface peeling occurred at the time of the process.

[Evaluation 2]

For each of the electrostatic chucks obtained in Examples 1 to 4 and Comparative example 1, evaluations of the following items (1) to (4) were performed, (1) Mechanical strength: Four-point bending strength of the alumina sintered body composing a part of the base at the room temperature was measured in conformity with JIS R1601. (2) Volume resistivity: The volume resistivity of the yttria sintered body that functions as the dielectric layer at the room temperature was measured in conformity with JIS C2141. Here, the applied voltage was set at 2000 V/mm. (3) Relative density: The relative density of the yttria sintered body that functions as the dielectric layer was measured by the Archimedean method using pure water as a medium. (4) Difference in coefficient of thermal expansion: The coefficient of thermal expansion of the alumina sintered body and the coefficient of thermal expansion of the yttria sintered body were measured, and a difference between both of the coefficients of thermal expansion was obtained.

(5) Corrosion resistance test: A part of the yttria sintered body exposed to the corrosive gas was masked. The yttria sintered body was held for five hours in mixed gas of NF3 and oxygen under conditions where plasma source power was 800 W, bias power was 300 W, and a pressure was 0.1 Torr. After the corrosion resistance test, a step difference between the masked portion and an unmasked portion was measured, and corrosion resistance of the yttria sintered body was evaluated as an amount (hereinafter, referred to as a "corrosion reduction amount") by which the yttria sintered body was reduced by the corrosion.

(6) Intermediate layer analysis: A composition of the intermediate layer formed between the alumina sintered body and the yttria sintered body was analyzed by using an electron probe micro analyzer (EPAM) and an X-ray diffraction analyzer. Moreover, the periphery of the intermediate layer on the outer circumferential portion from the dielectric electrode was observed by a scanning electron microscopes (SEM).

Table 2 shows evaluation results of the items (1) to (6) in combination with the compositions of the alumina sintered bodies and the yttria sintered bodies in Examples 1 to 4 and comparative example 1.

of the YAG and YAM layer were 10 to 100 μm according to the SEM observation. Meanwhile, in Comparative example 1, an apparent intermediate layer was not formed.

Examples 5 to 7 and Comparative Examples 2 to 4

Examples 5 to 7 and Comparative examples 2 to 4 are examples in each of which, by the same fabrication method as in Example 3, the coil-like resistance heating body containing

TABLE 2

| | Alumina sintered body (ESC electrode near portion) | | | Yttria sintered body (surface portion) | | | Difference in coefficient of thermal expansion (/K) | Side surface corrosion reduction amount (μm) | Intermediate analysis |
|---|---|---|---|---|---|---|---|---|---|
| | Composition (wt %) | Four-point bending strength (MPa) | Carbon content (wt %) | Composition (wt %) | Volume resistivity (Ω·cm) | Relative density (%) | | | |
| Example 1 | Alumina >99.9 | 460 | 0.04 | Yttria >99.9 | >1 × 10$^{16}$ | 99.8 | 0.3 × 10$^{-6}$ | 0.2 | YAG YAM |
| Example 2 | Alumina >99.9 | 460 | 0.04 | Yttria >99.9 | >1 × 10$^{16}$ | 99.8 | 0.3 × 10$^{-6}$ | 0.2 | YAG YAM |
| Example 3 | Alumina >99.9 | 460 | 0.04 | Yttria >99.9 | >1 × 10$^{16}$ | 99.8 | 0.3 × 10$^{-6}$ | 0.2 | YAG YAM |
| Example 4 | Alumina >99.9 | 460 | 0.04 | Yttria >99.9 | >1 × 10$^{16}$ | 99.8 | 0.3 × 10$^{-6}$ | 0.6 | YAG YAM |
| Comparative example 1 | Alumina >99.9 | 400 | 0.07 | Yttria >99.9 | 1 (Short-circuited) | 94 | Un-measurable | peeling | None |

As understood from Table 2, in any electrostatic chuck of Examples 1 to 4, the four-point bending strength of the alumina sintered body composing a part of the base at the room temperature was high, and the mechanical strength thereof was excellent. Moreover, in any electrostatic chuck of Examples 1 to 4, the volume resistivity of the yttria sintered body at the room temperature was as high as 1×10$^{16}$ Ω·cm or more, which was a value required for the dielectric layer in order to realize high suction force in the electrostatic chuck utilizing the Coulomb force.

Moreover, in any electrostatic chuck of Examples 1 to 4, the relative density of the yttria sintered body was as extremely high as 98% or more, and an extremely dense sintered body was obtained. Moreover, in any electrostatic chuck of Examples 1 to 4, the difference in coefficient of thermal expansion between the alumina sintered body and the yttria sintered body was suppressed to be small.

Furthermore, in any electrostatic chuck of Examples 1 to 4, the corrosion reduction amount of the yttria sintered body by the corrosion resistance test was extremely small, the surface corrosion was slight, and extremely excellent corrosion resistance was exerted. In order to investigate the corrosion resistance of the side surface portion, each of the electrostatic chucks was mounted in a plasma chamber, plasma was generated under the same conditions as those in the corrosion resistance test of the above-described item (5), each of the electrostatic chucks was exposed to the plasma, and a corrosion reduction amount of an unmasked portion on the side surface was measured. As a result, as shown in Table 2, Examples 1 to 4 were superior to Comparative example 1 in the corrosion resistance of the side surface portion. In particular, Examples 1 to 4 in each of which the side surface portion was covered with yttria exhibited excellent corrosion resistance. In Comparative example 1, peeling occurred, of which cause was supposed to be the microcracks in yttria.

Moreover, in any electrostatic chuck of Examples 1 to 4, the intermediate layer containing yttrium and aluminum was formed between the alumina sintered body and the yttria sintered body. Specifically, the intermediate layer containing the YAG layer and the YAM layer was formed. The thickness Nb is embedded in the inside of the support portion of the base, and yttria ceramics of the surface portion is formed not only on the substrate mounting surface but also on the side surface portion, and in which the carbon amounts in the alumina sintered bodies of the support portions are different from one another. In order to individually change the carbon amount in the alumina sintered body, when each alumina sintered body was fabricated, in addition to the calcined granules of alumina, granules of alumina, which were not calcined, were mixed at the time of forming the upper portion of the support portion, and a mixing ratio thereof was variously changed. In such a way, the alumina sintered bodies were fabricated. Moreover, Comparative example 4 is an example where the carbon amount of the yttria sintered body that forms the surface portion was increased by using yttria powder that was not calcined instead of the temporarily fired granulated powder of yttria.

For each of these examples and comparative examples, a heat cycle test, measurement of the leak current, and measurement of the suction force were performed. The heat cycle test is an accelerated test in which a temperature rise and a temperature drop between the room temperature (RT) and 200° C. are repeated. A heat cycle was applied while supplying electric power to the heater in the electrostatic chuck, inserting a thermocouple into the hole drilled in the alumina portion, and measuring a temperature of the vicinity of the portion of yttria ceramics.

With regard to the measurement of the leak current, a current flowing between the power supply for the electrostatic chuck and the ground when an 800V suction voltage was applied to the electrostatic chuck was measured by a measuring instrument. In this case, the flowing current is also a current flowing from the dielectric electrode through the heater and the interface between yttria and alumina to the outer circumferential edge portion of the electrostatic chuck.

The measured suction force is a value when 800V was applied. The suction force was measured by a probe method, in which a silicon-made disc with a diameter of one inch is mounted on the surface of the electrostatic chuck, and force when the disc is peeled off is measured by a load cell.

Results of these are shown in Table 3.

TABLE 3

| | Carbon content in alumina sintered body (wt %) | Carbon content in yttria surface portion (wt %) | Composition of alumina/yttria interface | Leak current (μA) @150° C. | Suction force (Pa) | After 1000 times heat cycle | | Interface peeling |
|---|---|---|---|---|---|---|---|---|
| | | | | | | Leak current (μA) | Suction force (Pa) | |
| Example 3 | 0.04 | 0.04 | YAG/YAM | 420 | 2500 | 420 | 2500 | None |
| Example 5 | 0.05 | 0.05 | YAG/YAM | 510 | 2400 | 510 | 2400 | None |
| Example 6 | 0.03 | 0.04 | YAG/YAM | 320 | 2700 | 320 | 2700 | None |
| Example 7 | 0.02 | 0.04 | YAG/YAM | 280 | 2800 | 280 | 2800 | None |
| Comparative example 2 | 0.06 | 0.05 | $Al_2O_3/Y_2O_3$ | 650 | 1800 | 870 | 1200 | Partially present |
| Comparative example 3 | 0.1 | 0.04 | $Al_2O_3/Y_2O_3$ | 840 | 1100 | 1800 | 300 | Present |
| Comparative example 4 | 0.04 | 0.07 | $Al_2O_3/Y_2O_3$ | 1300 | 400 | 1400 | 200 | Present |

As understood from Table 3, the carbon amount in alumina in the vicinity of the dielectric electrode is 0.05 wt % or less, the carbon amount in yttria therein is 0.05 wt % or less, and the intermediate ceramic layer is formed on the interface between yttria and alumina in the present invention. In such a way, an electrostatic chuck is capable of suppressing the leak current, enhancing the suction force, and stably maintaining the suction force even after long-term use thereof. The volume resistivity of alumina ceramics was $1\times10^{16}$ Ω·cm or more at room temperature, and was $1\times10^{14}$ Ω·cm or more at 150° C. in Examples 5 to 7, while it was less than $1\times10^{16}$ Ω·cm at room temperature and far less than $1\times10^{14}$ Ω·cm at 150° C. in Comparative example 2 to 4.

The volume resistivity of the yttria dielectric layer was $1\times10^{16}$ Ω·cm or more at the room temperature and $1\times10^{15}$ Ω·cm or more at 150° C. in Examples 5 to 7, while it was $1\times10^{14}$ Ω·cm at the room temperature in Comparative example 4.

While preferred embodiments of the present invention have been described using specific terms, such description is for illustrative purposes, and it is to be understood that changes and variations may be made without departing from the spirit or scope of the claims.

What is claimed is:

1. An electrostatic chuck, comprising:
   a plate-like base that is made of ceramics and has a substrate mounting surface on which a substrate is to be mounted; and
   a dielectric electrode embedded in the base,
   wherein the base includes a support portion made of alumina ceramics, and a surface and side portions that are made of yttria ceramics and form at least the substrate mounting surface of the base on a surface of the base and side surfaces of the base,
   wherein a carbon content in alumina ceramics in a vicinity of the dielectric electrode is 0.03 wt % or less, and
   wherein a thickness of a portion of the base, which forms the substrate mounting surface, is 0.2 mm to 0.5 mm, and a thickness of a portion of the base, which forms the side surface of the base, is 0.2 mm to 10 mm.

2. The electrostatic chuck according to claim 1, wherein volume resistivity of alumina ceramics concerned is $1\times10^{16}$ Ω·cm or more at room temperature, and is $1\times10^{14}$ Ω·cm or more at 150° C., and
   volume resistivity of yttria ceramics concerned is $1\times10^{16}$ Ω·cm or more at the room temperature, and is $1\times10^{15}$ Ω·cm or more at 150° C.

3. The electrostatic chuck according to claim 1, wherein an at least one of a YAG phase and a YAM phase, which contains yttrium and aluminum, is formed by a thickness of 10 μm or more to 100 μm or less between alumina ceramics and yttria ceramics.

4. The electrostatic chuck according to claim 1, wherein the dielectric electrode is embedded between alumina ceramics and yttria ceramics that forms the substrate mounting surface of the base.

5. The electrostatic chuck according to claim 1, further comprising:
   a heater that is a resistance heating body that contains niobium as a main component and is embedded in a support portion of a base,
   wherein a carbon content in alumina ceramics on a periphery of the resistance heating body is 0.05 wt % to 0.25 wt %, and the carbon content is higher than a carbon content in alumina ceramics in a vicinity of the dielectric electrode.

6. A manufacturing method of an electrostatic chuck, comprising the steps of:
   forming a plate-like alumina sintered body with a carbon content of 0.03 wt % or less from a raw material of alumina ceramics;
   forming a dielectric electrode on one surface of the alumina sintered body;
   forming an yttria member so as to cover the dielectric electrode and the surface and side portions of the alumina sintered body, on which the dielectric electrode is formed; and
   sintering the alumina sintered body and the yttria member while integrally pressing the alumina sintered body and the yttria member in a uniaxial direction, thereby forming a base with at least the substrate mounting surface and side surfaces of the base being made of yttria ceramics;
   wherein a thickness of a portion of the base, which forms the substrate mounting surface, is 0.2 mm to 0.5 mm, and a thickness of a portion of the base, which forms the side surface of the base, is 0.2 mm to 10 mm.

7. The manufacturing method of an electrostatic chuck according to claim 6, wherein the plate-like alumina member has a cutaway portion on an upper circumferential edge portion thereof, and a raw material of yttria ceramics is filled onto the cutaway portion in a case of forming the yttria member.

8. The manufacturing method of an electrostatic chuck according to claim 6, further comprising the step of: forming a resistance heating body on the other surface of the alumina sintered body before the step of forming an yttria member,
wherein, in the step of forming an yttria member, the yttria member is formed so as to cover the resistance heating body and the surface of the alumina sintered body, on which the resistance heating body is formed.

9. The manufacturing method of an electrostatic chuck according to claim 6, wherein a carbon amount in the raw material of yttria ceramics of the yttria member is 0.001 wt % or more to less than 0.05 wt %.

* * * * *